US012805400B2

(12) United States Patent
Kim et al.

(10) Patent No.: US 12,805,400 B2
(45) Date of Patent: Nov. 17, 2026

(54) SEMICONDUCTOR PACKAGES AND METHOD FOR FABRICATING THE SAME

(71) Applicant: Samsung Electronics Co., Ltd., Suwon-si (KR)

(72) Inventors: Wooyoung Kim, Suwon-si (KR); Sangkyu Lee, Suwon-si (KR); Jingu Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 410 days.

(21) Appl. No.: 18/446,844

(22) Filed: Aug. 9, 2023

(65) Prior Publication Data

US 2024/0258276 A1 Aug. 1, 2024

(30) Foreign Application Priority Data

Jan. 26, 2023 (KR) ........................ 10-2023-0010396

(51) Int. Cl.
*H10W 20/20* (2026.01)
*H10W 70/63* (2026.01)
(Continued)

(52) U.S. Cl.
CPC ........... *H10W 90/00* (2026.01); *H10W 20/20* (2026.01); *H10W 70/635* (2026.01); *H10W 70/685* (2026.01); *H10W 74/01* (2026.01); *H10W 74/117* (2026.01); *H10W 72/072* (2026.01); *H10W 72/951* (2026.01); *H10W 72/952* (2026.01); *H10W 80/312* (2026.01); *H10W 80/327* (2026.01); *H10W 90/722* (2026.01); *H10W 90/724* (2026.01); *H10W 90/792* (2026.01)

(58) Field of Classification Search
CPC ............. H10W 70/685; H10W 70/635; H10W 74/01; H10W 74/117; H10W 20/20
See application file for complete search history.

(56) References Cited

U.S. PATENT DOCUMENTS

| | | | |
|---|---|---|---|
| 9,881,894 | B2 | 1/2018 | Pendse |
| 10,438,927 | B2 | 10/2019 | Jung et al. |

(Continued)

FOREIGN PATENT DOCUMENTS

| | | | |
|---|---|---|---|
| KR | 10-2020-0099806 | A | 8/2020 |
| KR | 10-2021-0082051 | A | 7/2021 |
| KR | 10-2022-0151989 | A | 11/2022 |

*Primary Examiner* — Dale E Page
*Assistant Examiner* — Wilner Jean Baptiste
(74) *Attorney, Agent, or Firm* — Wolf, Greenfield & Sacks, P.C.

(57) ABSTRACT

A semiconductor package may include: a front side redistribution layer; a three-dimensional integrated circuit (3D IC) structure on the front side redistribution layer, the 3D IC structure including a first semiconductor chip die and a second semiconductor chip die having through-silicon vias (TSVs), the first semiconductor chip die on the second semiconductor chip die and electrically coupled with the front side redistribution layer by the TSVs; a printed circuit board on the front side redistribution layer and surrounding the 3D IC structure; a molding material on the front side redistribution layer and at least partially encapsulating the 3D IC structure and the printed circuit board; and a back side redistribution layer on the molding material.

13 Claims, 21 Drawing Sheets

(51) Int. Cl.

| | |
|---|---|
| ***H10W 70/685*** | (2026.01) |
| ***H10W 74/01*** | (2026.01) |
| ***H10W 74/10*** | (2026.01) |
| ***H10W 90/00*** | (2026.01) |
| *H10W 72/00* | (2026.01) |
| *H10W 72/90* | (2026.01) |
| *H10W 80/00* | (2026.01) |

(56) References Cited

U.S. PATENT DOCUMENTS

| | | | | |
|---|---|---|---|---|
| 10,692,836 | B2 | 6/2020 | Pendse | |
| 10,832,986 | B2 | 11/2020 | Cho et al. | |
| 10,879,197 | B2 | 12/2020 | Wan et al. | |
| 10,943,878 | B2 | 3/2021 | Lee et al. | |
| 11,217,552 | B2 | 1/2022 | Chen et al. | |
| 11,251,154 | B2 | 2/2022 | Pendse | |
| 11,393,795 | B2 | 7/2022 | Park et al. | |
| 2010/0219524 | A1* | 9/2010 | Shen | H10W 40/251 257/E23.06 |
| 2014/0087568 | A1 | 3/2014 | Noda et al. | |
| 2015/0303174 | A1* | 10/2015 | Yu | H01L 25/0652 438/109 |
| 2017/0207197 | A1* | 7/2017 | Yu | H10W 70/09 |
| 2021/0098421 | A1 | 4/2021 | Wu et al. | |
| 2021/0193582 | A1 | 6/2021 | Yu et al. | |
| 2022/0359358 | A1 | 11/2022 | Kim | |
| 2023/0065378 | A1* | 3/2023 | Kim | H01L 25/0657 |

* cited by examiner

SEMICONDUCTOR PACKAGES AND METHOD FOR FABRICATING THE SAME

CROSS-REFERENCE TO RELATED APPLICATION

This application claims priority to and the benefit of Korean Patent Application No. 10-2023-0010396, filed in the Korean Intellectual Property Office on Jan. 26, 2023, the entire contents of which are incorporated herein by reference.

BACKGROUND

The present disclosure relates to semiconductor packages and a method for fabricating the same.

The semiconductor industry has been seeking to improve integration density such that more passive or active devices can be integrated in a given area. However, in the process, the development of technology for dramatically reducing circuit line widths in the semiconductor front-end process gradually faced limitations. For this reason, the semiconductor industry has tended to develop semiconductor packaging technologies capable of realizing high integration density to supplement the limitations of the semiconductor front-end process. As one of the semiconductor packaging technologies developed depending on this tendency, package-on-package (POP) for stacking an upper semiconductor package on top of a lower semiconductor package is well known.

The existing package-on-package (POP) technology is completed through a process of forming a lower semiconductor package by mounting a semiconductor chip on a front side redistribution layer (FRDL) and encapsulating the semiconductor chip (for example, a system-on-chip (SOC)) with a molding material, and forming a back side redistribution layer (BRDL) on the lower semiconductor package, and connecting an upper semiconductor package (for example, a memory package) to the upper part of the lower semiconductor package through the back side redistribution layer (BRDL).

A system-on-chip (SOC) which is included in a lower semiconductor package of the package-on-package (POP) technology is one semiconductor chip having individual semiconductors, such as microprocessors, memory semiconductors, digital signal processing chips, and wireless modems, integrated therein. Since a number of functions are integrated in one semiconductor chip to drive all of the applications and control and manage system devices, a number of interface devices, and so on, if a system-on-chip (SOC) is used, it is possible to reduce the size of a semiconductor package and minimize power which is consumed in the semiconductor package, as compared to when the existing individual semiconductors are used.

However, in the case where individual semiconductors in a system-on-chip (SOC) include any defective semiconductors manufactured at a low manufacturing cost by a relatively old process (for example, a wireless modem), semiconductors manufactured at a high manufacturing cost by a new process (for example, microprocessors and memory semiconductors) must also be discarded together. Therefore, if system-on-chips (SOCs) can be manufactured in a multi-die structure by distinguishing them, the yield of system-on-chips (SOCs) can increase.

Therefore, it is desirable to develop a new semiconductor packaging technology capable of solving the problems of the existing package-on-package (POP) technology.

SUMMARY

The present disclosure provides a semiconductor package and a method for fabricating the semiconductor package having advantages of being able to implement a system-on-chip (SOC) as a three-dimensional integrated circuit (3D IC) structure by distinguishing individual semiconductors to be included in a system-on-chip (SOC) included in the package-on-package (POP) technology under a predetermined criterion, and stacking each of the individual semiconductors on a front side redistribution layer (FRDL) in a package-on-package (POP) fabricating process.

Also, the present disclosure provides a semiconductor package and a method for fabricating the semiconductor package having advantages of disposing a 3D IC structure included in the package-on-package (POP) technology inside a cavity of an embedded trace substrate (ETS).

An embodiment of the present disclosure provides a semiconductor package including: a front side redistribution layer; a three-dimensional integrated circuit (3D IC) structure on the front side redistribution layer, the 3D IC structure including a first semiconductor chip die and a second semiconductor chip die having through-silicon vias (TSVs), the first semiconductor chip die on the second semiconductor chip die and electrically coupled with the front side redistribution layer by the TSVs; a printed circuit board on the front side redistribution layer and surrounding the 3D IC structure; a molding material on the front side redistribution layer and at least partially encapsulating the 3D IC structure and the printed circuit board; and a back side redistribution layer on the molding material.

The semiconductor package may further include connection members between the first semiconductor chip die and the second semiconductor chip die, and the connection members may include micro bumps.

The first semiconductor chip die may include a plurality of first bonding pads and a first insulating layer, and the second semiconductor chip die may include a plurality of second bonding pads and a second insulating layer.

The plurality of first bonding pads may be directly bonded to the plurality of second bonding pads.

The plurality of first bonding pads and the plurality of second bonding pads may include copper (Cu).

The first insulating layer may be directly bonded to the second insulating layer.

The first insulating layer and the second insulating layer may include silicon oxide.

The second semiconductor chip die may include a plurality of connection terminals, the front side redistribution layer may include a plurality of redistribution vias at an uppermost level thereof, and the plurality of redistribution vias may be directly bonded to the plurality of connection terminals.

The molding material may include an epoxy molding compound (EMC).

The printed circuit board may include an embedded trace substrate (ETS).

The 3D IC structure may include a system-on-chip (SOC).

Another embodiment of the present disclosure provides a semiconductor package including: a front side redistribution layer including a plurality of first redistribution vias; a three-dimensional integrated circuit (3D IC) structure on the front side redistribution layer, the 3D IC structure including a first semiconductor chip die and a second semiconductor chip die having through-silicon vias (TSVs), the first semiconductor chip die on the second semiconductor chip die and electrically coupled with the front side redistribution layer by the TSVs; a printed circuit board on the front side redistribution layer and surrounding the 3D IC structure; a plurality of conductive fillers on the printed circuit board; a molding material on the front side redistribution layer and at least partially encapsulating the 3D IC structure, the printed circuit board, and the plurality of conductive fillers; a back side redistribution layer on the molding material and including a plurality of second redistribution vias; and a third semiconductor chip die on the back side redistribution layer.

A width of an uppermost part of each first redistribution via of the plurality of first redistribution vias may be smaller than a width of a lowermost part of each first redistribution via of the plurality of first redistribution vias, and a width of an uppermost part of each second redistribution via of the plurality of second redistribution vias may be larger than a width of a lowermost part of each second redistribution via of the plurality of second redistribution vias.

Yet another embodiment of the present disclosure provides a method for fabricating a semiconductor package, the method including: forming a cavity in a printed circuit board; forming a three-dimensional integrated circuit (3D IC) structure inside the cavity, the 3D IC structure including a first semiconductor chip die on a second semiconductor chip die having through-silicon vias (TSVs); at least partially encapsulating the printed circuit board and the 3D IC structure with a molding material; forming a front side redistribution layer on a lower surface of the printed circuit board and a lower surface of the second semiconductor chip die, wherein the front side redistribution layer is electrically coupled with the first semiconductor chip die by the TSVs; and forming a back side redistribution layer on the molding material.

The semiconductor package may include a fan-out wafer-level package (FOWLP) or a fan-out panel-level package (FOPLP).

Forming a 3D IC structure inside the cavity may include mounting the 3D IC structure manufactured in advance.

Forming a 3D IC structure inside the cavity may include forming the first semiconductor chip die, and bonding the second semiconductor chip die on the first semiconductor chip die.

Bonding the second semiconductor chip die on the first semiconductor chip die may be performed by hybrid bonding.

Bonding the second semiconductor chip die on the first semiconductor chip die may include bonding the first semiconductor chip die and the second semiconductor chip die by micro bumps.

The method for fabricating the semiconductor package may further include forming a plurality of conductive fillers on an upper surface of the printed circuit board after forming the front side redistribution layer on the lower surface of the printed circuit board and the lower surface of the second semiconductor chip die.

According to some embodiments, in order to prevent the yield of system-on-chips (SOCs) from decreasing due to defects of semiconductors fabricated using old processes at low manufacturing costs, such as wireless modems, system-on-chips (SOCs) in the package-on-package (POP) technology can be implemented as 3D IC structures.

According to some embodiments, the fabricating process of sequentially stacking system-on-chips (SOCs) as 3D IC structures is included in the package-on-package (POP) fabricating process. Therefore, it is not necessarily required to perform a process of separately fabricating 3D IC structures, and it is possible to reduce use of an epoxy molding compound (EMC) for encapsulating 3D IC structures when separately fabricating 3D IC structures.

According to some embodiments, 3D IC structures which are included in the package-on-package (POP) technology may be disposed in cavities of an embedded trace substrate (ETS). Therefore, it is possible to provide a semiconductor package which has improved rigidity, is resistant to warpage, and has high reliability

DETAILED DESCRIPTION

Figure 1:
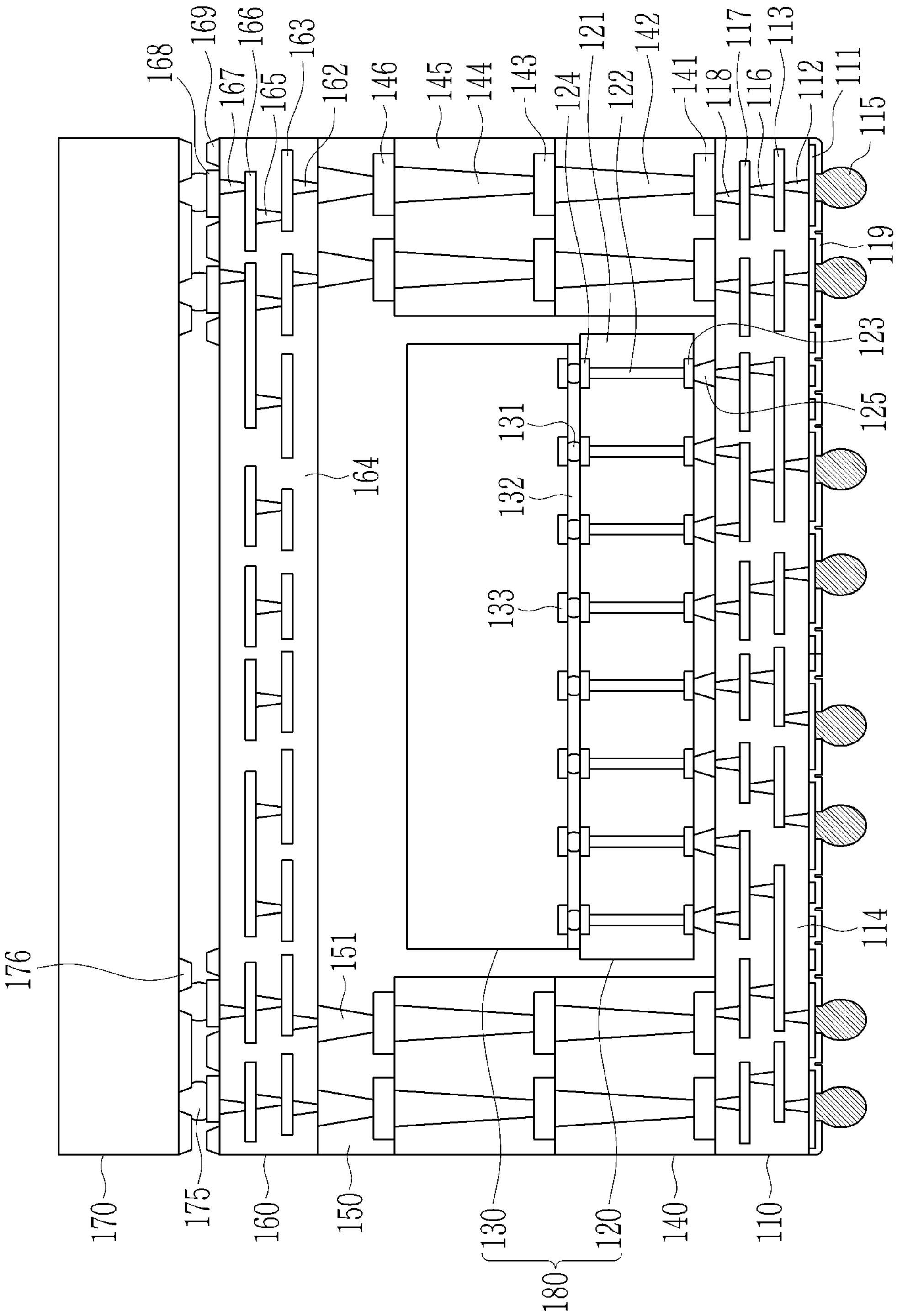
FIG. 1 is a cross-sectional view illustrating a semiconductor package of an embodiment including a three-dimensional integrated circuit (3D IC) structure made by sequentially stacking a first semiconductor chip die and a second semiconductor chip die using connection members in the process of fabricating the semiconductor package.

In the following detailed description, only certain embodiments of the present inventive concepts have been shown and described, simply by way of illustration. The present inventive concepts can be variously implemented and is not limited to the following example embodiments.

The drawings and description are to be regarded as illustrative in nature and not restrictive. Like reference numerals designate like elements throughout the specification.

In addition, the size and thickness of each configuration shown in the drawings may be arbitrarily shown for understanding and ease of description, but the present inventive concepts are not limited thereto.

Throughout this specification, when a part is referred to as being "connected" to another part, it may be directly connected to the other part, or may be connected to the other part indirectly with any other elements interposed therebetween. In addition, unless explicitly described to the contrary, the word "comprise", and variations such as "comprises" or "comprising", will be understood to imply the inclusion of stated elements but not the exclusion of any other elements.

Further, it will be understood that when an element such as a layer, film, region, or substrate is referred to as being "on" another element, it can be directly on the other element or intervening elements may also be present. In contrast, when an element is referred to as being "directly on" another element, there are no intervening elements present. Further, when an element is "above" or "on" a reference portion, the element is located above or below the reference portion, and it does not necessarily mean that the element is located "above" or "on" in a direction opposite to gravity.

Further, in the entire specification, when it is referred to as "on a plane", it means when a target part is viewed from above, and when it is referred to as "on a cross-section", it means when the cross-section obtained by cutting a target part vertically is viewed from the side.

Hereinafter, a semiconductor package and a method for fabricating the semiconductor package according to example embodiments will be described with reference to the drawings.

FIG. 1 is a cross-sectional view illustrating a semiconductor package 100 of an embodiment including a three-dimensional integrated circuit (3D IC) structure 180 made by sequentially stacking a first semiconductor chip die 130 and a second semiconductor chip die 120 using connection members 131 in the process of fabricating the semiconductor package 100.

Referring to FIG. 1, the semiconductor package 100 may include a front side redistribution layer 110, the 3D IC structure 180 including the first semiconductor chip die 130 and the second semiconductor chip die 120, an embedded trace substrate (ETS) 140, conductive fillers 151, a molding material 150, a back side redistribution layer 160, a third semiconductor chip die 170, and external connection members 115. The semiconductor package 100 may include a fan-out wafer-level package (FOWLP) or a fan-out panel-level package (FOPLP).

The front side redistribution layer 110 may include a dielectric layer 114, and first redistribution vias 112, first redistribution lines 113, second redistribution vias 116, second redistribution lines 117, and third redistribution vias 118 formed in the dielectric layer 114. In other embodiments, a redistribution layer having fewer or more redistribution lines and redistribution vias is included in the scope of this disclosure.

The dielectric layer 114 may include a photosensitive polymer layer. Photosensitive polymers are materials applicable to a photolithography process to form fine patterns. In an embodiment, the dielectric layer 114 may include photoimageable dielectric (PID) (a photosensitive dielectric) which is used in a redistribution process. As an embodiment, the photoimageable dielectric (PID) may include a polyimide-based photosensitive polymer, a novolac-based photosensitive polymer, polybenzoxazole, a silicon-based polymer, an acrylate-based polymer, or an epoxy-based polymer. In an embodiment, the photoimageable dielectric (PID) may have a resolution of 3 μm.

The first redistribution vias 112 are disposed between the first redistribution lines 113 and bonding pads 111. The first redistribution vias 112 electrically couple the first redistribution lines 113 with the external connection members 115 connected to the bonding pads 111 in the vertical direction. The first redistribution lines 113 are disposed between the first redistribution vias 112 and the second redistribution vias 116. The first redistribution lines 113 electrically couple the first redistribution vias 112 with the second redistribution vias 116 in the horizontal direction. The second redistribution vias 116 are disposed between the first redistribution lines 113 and the second redistribution lines 117. The second redistribution vias 116 electrically couple the first redistribution lines 113 with the second redistribution lines 117 in the vertical direction. The second redistribution lines 117 are disposed between the second redistribution vias 116 and the third redistribution vias 118. The second redistribution lines 117 electrically couple the second redistribution vias 116 with the third redistribution vias 118 in the horizontal direction. The third redistribution vias 118 are disposed between the second redistribution lines 117 and a first wiring layer 141 of the ETS 140. The third redistribution vias 118 electrically couple the second redistribution lines 117 with the first wiring layer 141 of the ETS 140 in the vertical direction.

The 3D IC structure 180 may include the first semiconductor chip die 130 and the second semiconductor chip die 120. A 3D IC is an integrated circuit implemented as a three-dimensional single chip by a technique of stacking circuits in the vertical direction, not by the existing technique of arranging circuits in the horizontal direction. If the vertical stacking technique is used, it is possible to implement more elements in the same silicon wafer area. Therefore, it becomes possible to reduce the manufacturing cost and improve the performance.

The second semiconductor chip die 120 may include one or more second semiconductor chips 121, through-silicon vias (TSVs) 122, lower bonding pads 123, upper bonding pads 124, and connection terminals 125. In an embodiment, the second semiconductor chips 121 may include a central processing unit (CPU) or a graphic processing unit (GPU). The through-silicon vias (TSVs) 122 are disposed between the lower bonding pads 123 and the upper bonding pads 124. The through-silicon vias (TSVs) 122 electrically couple the lower bonding pads 123 with the upper bonding pads 124.

In the 3D IC structure 180, the first semiconductor chip die 130 is disposed spaced apart from the front side redistribution layer 110 which transmits signals and power. For this reason, the through-silicon vias (TSVs) 122 are disposed between the second semiconductor chips 121 of the second semiconductor chip die 120 and are connected to the first semiconductor chip die 130 so as to increase the speed in receiving and responding signals and power of the first semiconductor chip die 130.

The lower bonding pads 123 are disposed between the through-silicon vias (TSVs) 122 and the connection terminals 125, and electrically couple the through-silicon vias (TSVs) 122 with the connection terminals 125. The upper bonding pads 124 are disposed between the through-silicon vias (TSVs) 122 and the connection members 131. The upper bonding pads 124 electrically couple the through-silicon vias (TSVs) 122 with the first semiconductor chip die 130 connected to the connection members 131. The connection terminals 125 are disposed between the lower bonding pads 123 and the front side redistribution layer 110. The connection terminals 125 electrically couple the lower bonding pads 123 with the front side redistribution layer 110. In an embodiment, the diameter or width of the horizontal cross sections of the connection terminals 125 may be 10 μm to 300 μm in consideration of alignments allowable during exposure.

The first semiconductor chip die 130 may include one or more first semiconductor chips and bonding pads 133. In an embodiment, the first semiconductor chips may include a wireless modem. The bonding pads 133 of the first semiconductor chip die 130 are bonded to the connection members 131 to be electrically coupled with them. In an embodiment, the connection members 131 may include micro bumps. An insulating member 132 may surround the connection members 131 between the first semiconductor chip die 130 and the second semiconductor chip die 120. In an embodiment, the insulating member 132 may include an underfill material.

The ETS 140 may include the first wiring layer 141, first vias 142, a second wiring layer 143, second vias 144, a third wiring layer 146, and an insulating layer 145. The ETS 140 is disposed between the front side redistribution layer 110 and the conductive fillers 151, and electrically couples the front side redistribution layer 110 with the conductive fillers 151. Like this, the 3D IC structure 180 is disposed in a cavity of the ETS 140. Therefore, it is possible to provide a semiconductor package 100 which has improved rigidity, is resistant to warpage, and has high reliability.

The first wiring layer 141 is disposed between the third redistribution vias 118 of the front side redistribution layer 110 and the first vias 142. The first wiring layer 141 electrically couples the third redistribution vias 118 of the front side redistribution layer 110 with the first vias 142. The first vias 142 are disposed between the first wiring layer 141 and the second wiring layer 143. The first vias 142 electrically couple the first wiring layer 141 with the second wiring layer 143. The second wiring layer 143 is disposed between the first vias 142 and the second vias 144. The second wiring layer 143 electrically couples the first vias 142 with the second vias 144. The second vias 144 are disposed between the second wiring layer 143 and the third wiring layer 146. The second vias 144 electrically couple the second wiring layer 143 with the third wiring layer 146. The third wiring layer 146 is disposed between the second vias 144 and the conductive fillers 151. The third wiring layer 146 electrically couples the second vias 144 with the conductive fillers 151. The insulating layer 145 may at least partially surround the first wiring layer 141, the first vias 142, the second wiring layer 143, and the second vias 144.

The molding material 150 at least partially encapsulates the first semiconductor chip die 130, the second semiconductor chip die 120, the ETS 140, and the conductive fillers, on the front side redistribution layer 110. Specifically, the molding material 150 covers the side and upper surfaces of the first semiconductor chip die 130, the side and lower surfaces of the second semiconductor chip die 120, the side and upper surfaces of the ETS 140, the side surface of the connection terminals 125, and the side surfaces of the conductive fillers 151.

The conductive fillers 151 are disposed between the third wiring layer 146 of the ETS 140 and fourth redistribution vias 162 of the back side redistribution layer 160, and electrically couple the third wiring layer 146 of the ETS 140 with the fourth redistribution vias 162 of the back side redistribution layer 160.

The back side redistribution layer 160 may include a dielectric layer 164, and the fourth redistribution vias 162, third redistribution lines 163, fifth redistribution vias 165, fourth redistribution lines 166, and sixth redistribution vias 167 formed in the dielectric layer 164, and bonding pads 168 and an insulating layer 169 disposed on the dielectric layer 164. In embodiments, a redistribution layer having fewer or more redistribution lines, redistribution vias, and bonding pads is included in the scope of this disclosure.

The dielectric layer 164 may include a photosensitive polymer layer. Photosensitive polymers are materials applicable to a photolithography process to form fine patterns. In an embodiment, the dielectric layer 164 may include photoimageable dielectric (PID) (a photosensitive dielectric) which is used in a redistribution process. The photoimageable dielectric (PID) may include a polyimide-based photosensitive polymer, a novolac-based photosensitive polymer, polybenzoxazole, a silicon-based polymer, an acrylate-based polymer, or an epoxy-based polymer. In an embodiment, the photoimageable dielectric (PID) may have a resolution of 3 μm.

The fourth redistribution vias 162 are disposed between the third redistribution lines 163 and the conductive fillers 151. The fourth redistribution vias 162 electrically couple the third redistribution lines 163 with the conductive fillers 151 in the vertical direction. The third redistribution lines 163 are disposed between the fourth redistribution vias 162 and the fifth redistribution vias 165. The third redistribution lines 163 electrically couple the fourth redistribution vias 162 with the fifth redistribution vias 165 in the horizontal direction. The fifth redistribution vias 165 are disposed between the third redistribution lines 163 and the fourth redistribution lines 166. The fifth redistribution vias 165 electrically couple the third redistribution lines 163 with the fourth redistribution lines 166 in the vertical direction. The fourth redistribution lines 166 are disposed between the fifth redistribution vias 165 and the sixth redistribution vias 167. The fourth redistribution lines 166 electrically couple the fifth redistribution vias 165 with the sixth redistribution vias 167 in the horizontal direction. The sixth redistribution vias 167 are disposed between the fourth redistribution lines 166 and the bonding pads 168. The sixth redistribution vias 167 electrically couple the fourth redistribution lines 166 with the bonding pads 168 in the vertical direction.

The bonding pads 168 are disposed between the sixth redistribution vias 167 and connection members 175. The bonding pads 168 electrically couple the sixth redistribution vias 167 with the connection members 175.

The insulating layer 169 is disposed so as to surround the individual bonding pads 168 in order to help prevent short-circuiting of the bonding pads 168. In an embodiment, the insulating layer 169 may include solder resist.

The shapes of the first, second, and third redistribution vias 112, 116, and 118 in the front side redistribution layer 110 may be symmetrical with the shapes of the fourth, fifth, and sixth redistribution vias 162, 165, and 167 in the back side redistribution layer 160. The width of the uppermost part of each redistribution via of the first, second, and third redistribution vias 112, 116, and 118 in the front side redistribution layer 110 may be smaller than the width of its lowermost part, and the width of the uppermost part of each redistribution via of the fourth, fifth, and sixth redistribution vias 162, 165, and 167 in the back side redistribution layer 160 may be larger than the width of its lowermost part.

Figure 17:
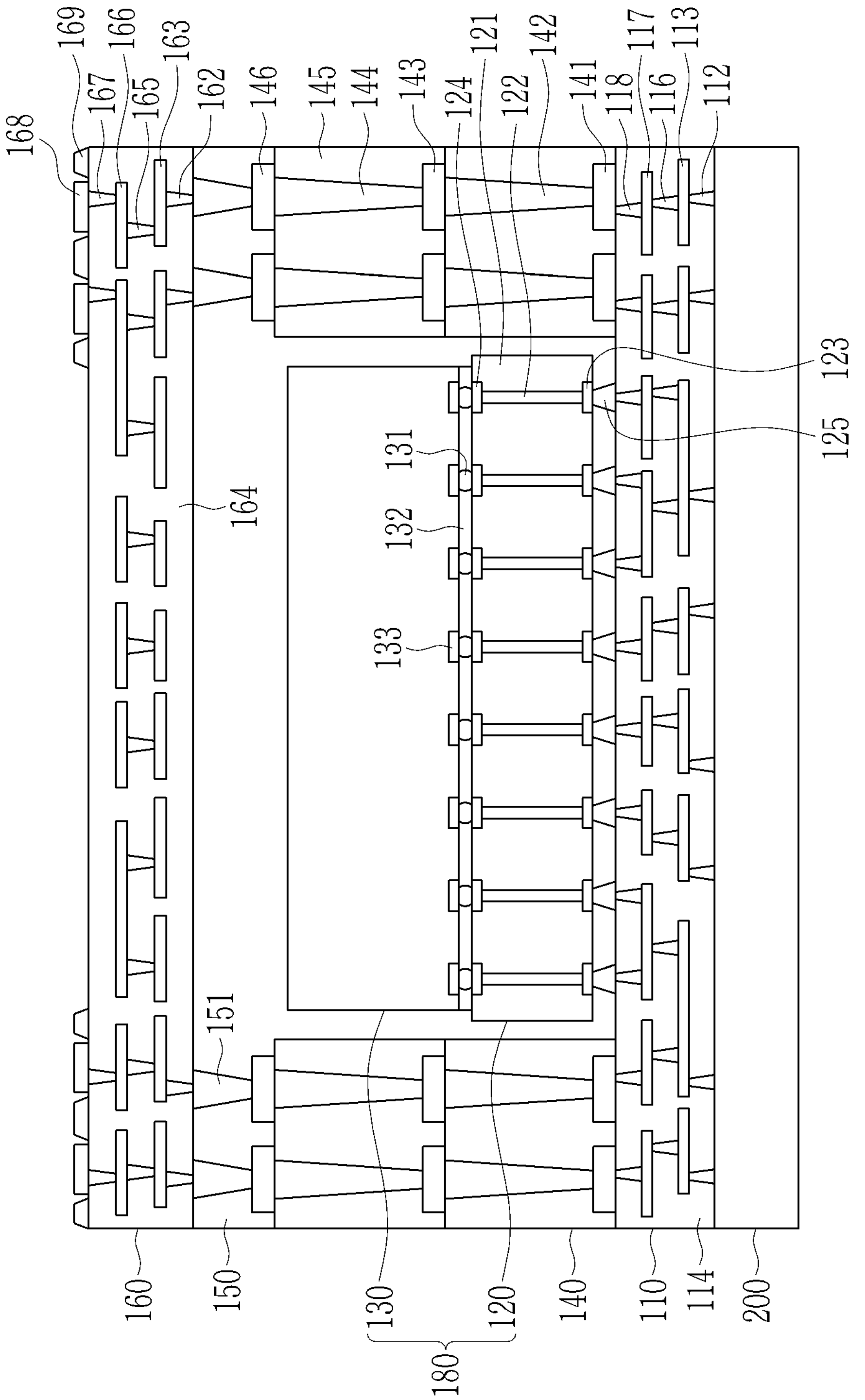
FIG. 17 is a cross-sectional view illustrating a step of forming a back side redistribution layer on the molding material, as one step of the series of steps of the method for fabricating the semiconductor package.

This is attributable to the method for fabricating a semiconductor package (a chip-first process) according to this disclosure in which in a fan-out wafer-level package (FOWLP) or a fan-out panel-level package (FOPLP), a 3D IC structure 180 is mounted, and a first carrier 190 is attached to the top of the 3D IC structure 180, whereby a front side redistribution layer 110 is formed (see FIG. 13), and then a second carrier 200 is attached to the lower surface of the 3D IC structure 180, whereby a back side redistribution layer 160 is formed (see FIG. 17).

The external connection members 115 electrically couple an external component with the front side redistribution layer 110 connected to the bonding pads 111 disposed beneath the front side redistribution layer 110. An insulating layer 119 may have a plurality of openings for soldering. In an embodiment, the insulating layer 119 may include solder resist. The insulating layer 119 helps prevent the external connection members 115 from being short-circuited.

The third semiconductor chip die 170 is disposed on the back side redistribution layer 160. The third semiconductor chip die 170 is electrically coupled with the back side redistribution layer 160 using the connection members 175. The third semiconductor chip die 170 may include an insulating layer 176 provided beneath it to help prevent short-circuiting of the connection members 175. In an embodiment, the insulating layer 176 may include solder resist.

Figure 2:
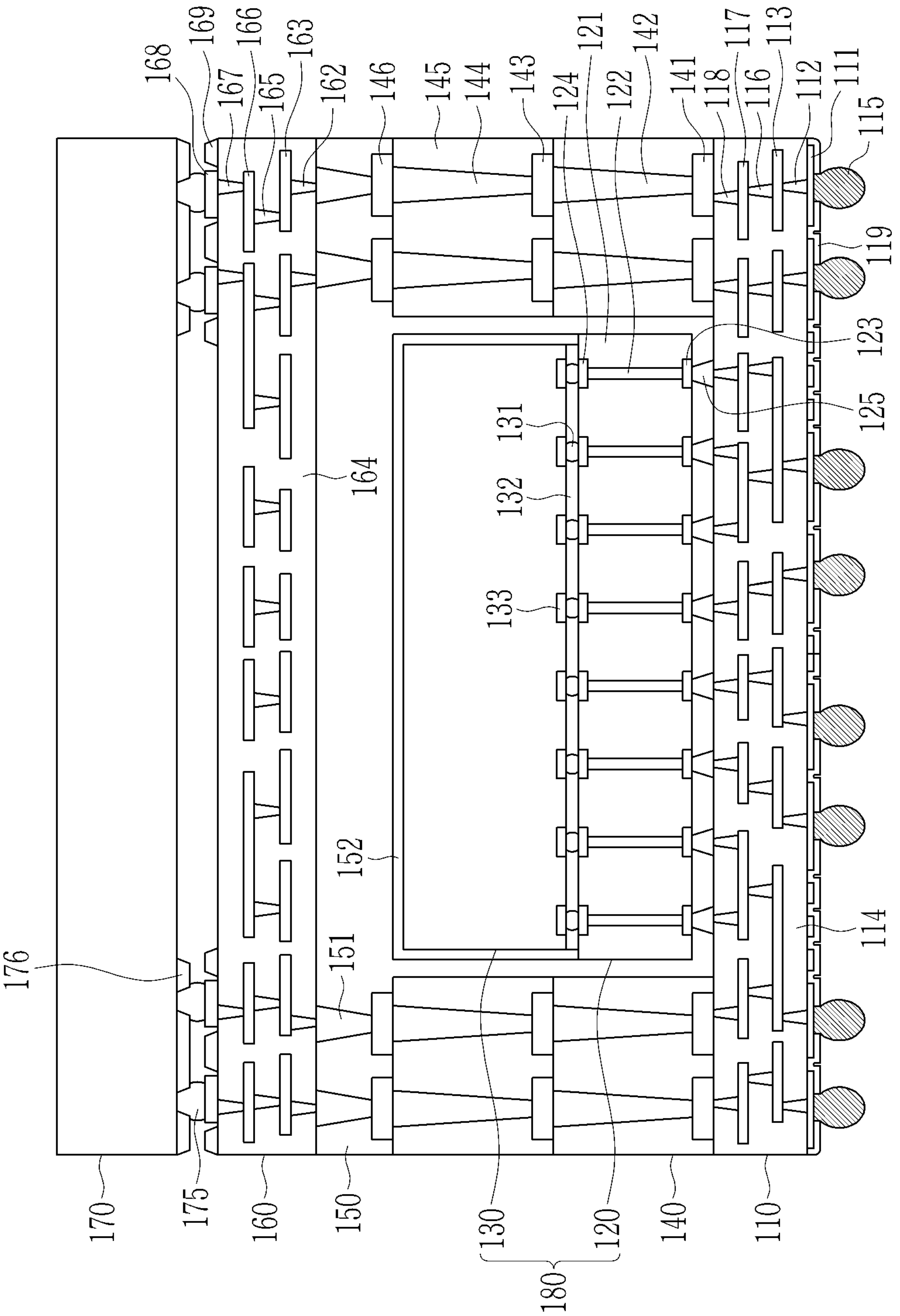
FIG. 2 is a cross-sectional view illustrating a semiconductor package of an embodiment including a 3D IC structure that is fabricated in a separate process which is not included in the process of fabricating the semiconductor package.

FIG. 2 is a cross-sectional view illustrating a semiconductor package 100 of an embodiment including a 3D IC structure 180 that is fabricated in a separate process which is not included in the process of fabricating the semiconductor package 100.

Referring to FIG. 2, the semiconductor package 100 may include the 3D IC structure 180 fabricated in advance. Since the 3D IC structure 180 is fabricated by performing the separate process, a second molding material 152 is further included in the 3D IC structure 180. With the second molding material 152, a first semiconductor chip die 130 is encapsulated on a second semiconductor chip die 120. In an embodiment, the second molding material 152 may be a different type of molding material from the molding material 150. In another embodiment, the second molding material 152 may be the same type of molding material as the molding material 150.

The features of the configuration of the semiconductor package 100 of FIG. 1 described above may be applied to the configuration of the semiconductor package 100 of FIG. 2 except that the 3D IC structure 180 further includes the second molding material 152.

Figure 3:
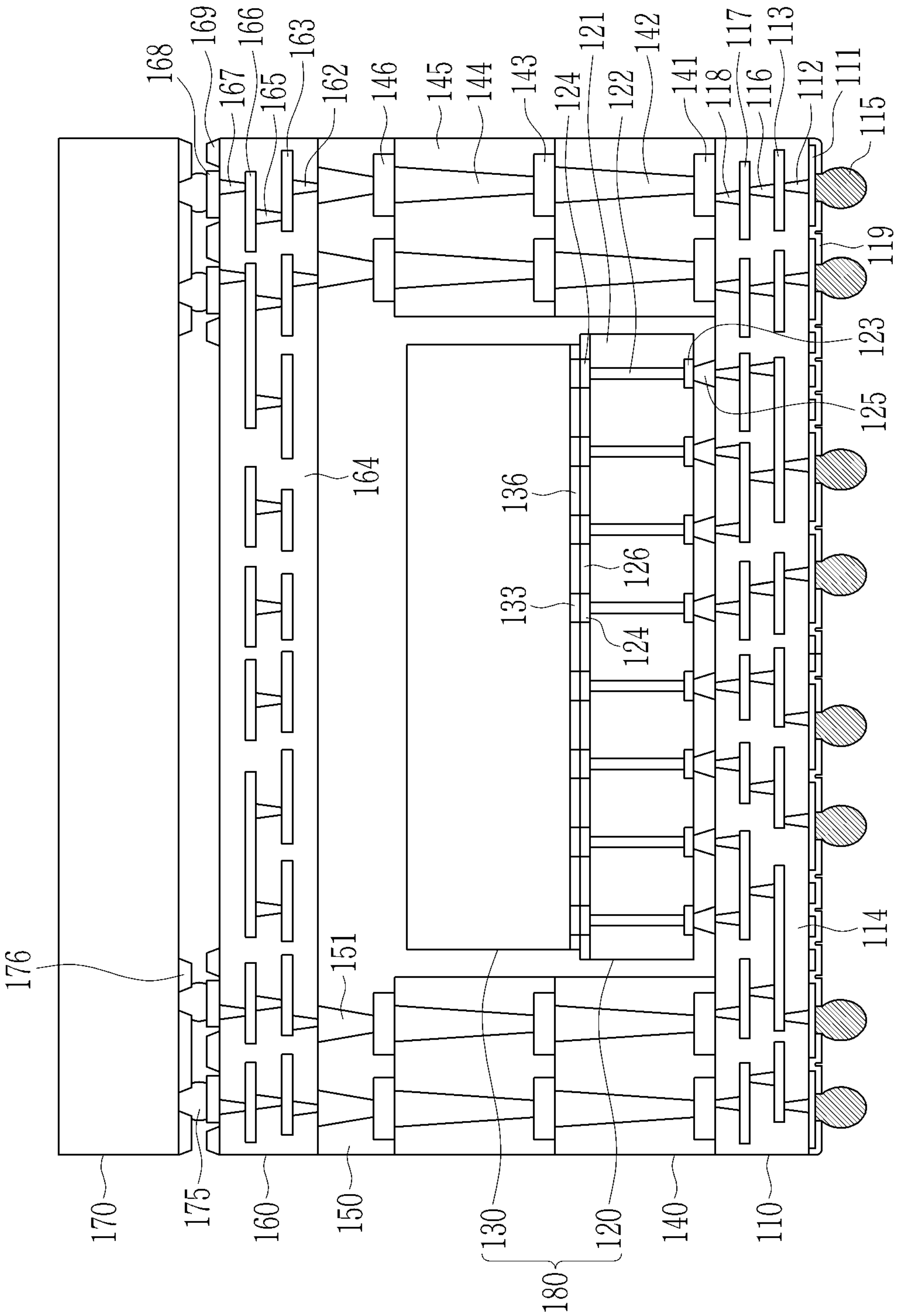
FIG. 3 is a cross-sectional view illustrating a semiconductor package of an embodiment including a 3D IC structure made by sequentially stacking a first semiconductor chip die and a second semiconductor chip die by hybrid bonding in the process of fabricating the semiconductor package.

FIG. 3 is a cross-sectional view illustrating a semiconductor package 100 of an embodiment including a 3D IC structure 180 made by sequentially stacking a first semiconductor chip die 130 and a second semiconductor chip die 120 by hybrid bonding in the process of fabricating the semiconductor package 100.

Referring to FIG. 3, the semiconductor package 100 may include the 3D IC structure 180 made by bonding the first semiconductor chip die 130 and the second semiconductor chip die 120 by hybrid bonding. The first semiconductor chip die 130 may include bonding pads 133 and a silicon insulating layer 136 provided on its lower surface. The second semiconductor chip die 120 may include bonding pads 124 and a silicon insulating layer 126 provided on its upper surface. The bonding pads 133 of the first semiconductor chip die 130 are directly bonded to the bonding pads 124 of the second semiconductor chip die 120 by metal-to-metal bonding of hybrid bonding, and the silicon insulating layer 136 of the first semiconductor chip die 130 is directly bonded to the silicon insulating layer 126 of the second semiconductor chip die 120 by nonmetal-to-nonmetal bonding of the hybrid bonding.

In an embodiment, the bonding pads 133 of the first semiconductor chip die 130 and the bonding pads 124 of the second semiconductor chip die 120 may include copper (Cu). In another embodiment, the bonding pads 133 of the first semiconductor chip die 130 and the bonding pads 124 of the second semiconductor chip die 120 may be a metallic material to which hybrid bonding can be applied. In an embodiment, the silicon insulating layer 136 of the first semiconductor chip die 130 and the silicon insulating layer 126 of the second semiconductor chip die 120 may include silicon oxide. In an embodiment, the silicon insulating layer

136 of the first semiconductor chip die 130 and the silicon insulating layer 126 of the second semiconductor chip die 120 may include $SiO_2$. In other embodiments, the silicon insulating layer 136 of the first semiconductor chip die 130 and the silicon insulating layer 126 of the second semiconductor chip die 120 may be silicon nitride, silicon oxynitride, or other suitable dielectric materials.

The features of the configuration of the semiconductor package 100 of FIG. 1 described above may be applied to the configuration of the semiconductor package 100 of FIG. 3 except that the first semiconductor chip die 130 and the second semiconductor chip die 120 are bonded by hybrid bonding.

Figure 4:
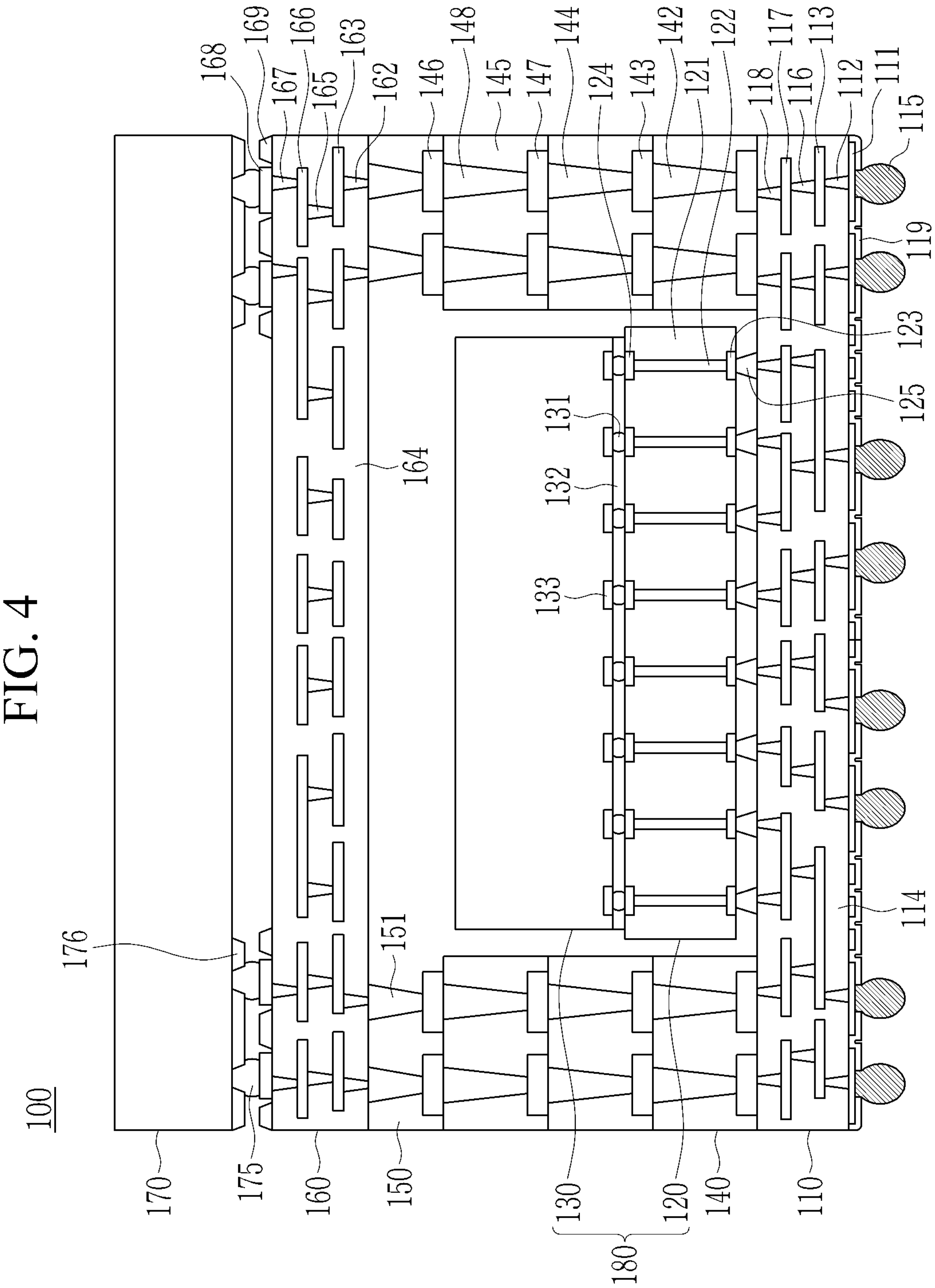
FIG. 4 is a cross-sectional view illustrating a semiconductor package of an embodiment which is fabricated by disposing a 3D IC structure, made by sequentially stacking a first semiconductor chip die and a second semiconductor chip die, in an embedded trace substrate (ETS) having vias of three layers, in the process of fabricating the semiconductor package.

FIG. 4 is a cross-sectional view illustrating a semiconductor package 100 of an embodiment which is fabricated by disposing a 3D IC structure 180, made by sequentially stacking the first semiconductor chip die 130 and the second semiconductor chip die 120, in an ETS 140 having vias of three layers, in the process of fabricating the semiconductor package 100.

Referring to FIG. 4, the ETS 140 may further include a fourth wiring layer 147 and third vias 148, in addition to a first wiring layer 141, first vias 142, a second wiring layer 143, second vias 144, a third wiring layer 146, and an insulating layer 145. In the embodiment of FIG. 1, the ETS 140 has the vias of the two layers; however, in the embodiment of FIG. 4, the ETS 140 has the vias of the three layers. In other embodiments, an ETS 140 having fewer or more wiring layers and vias is included in the scope of this disclosure.

Figure 5:
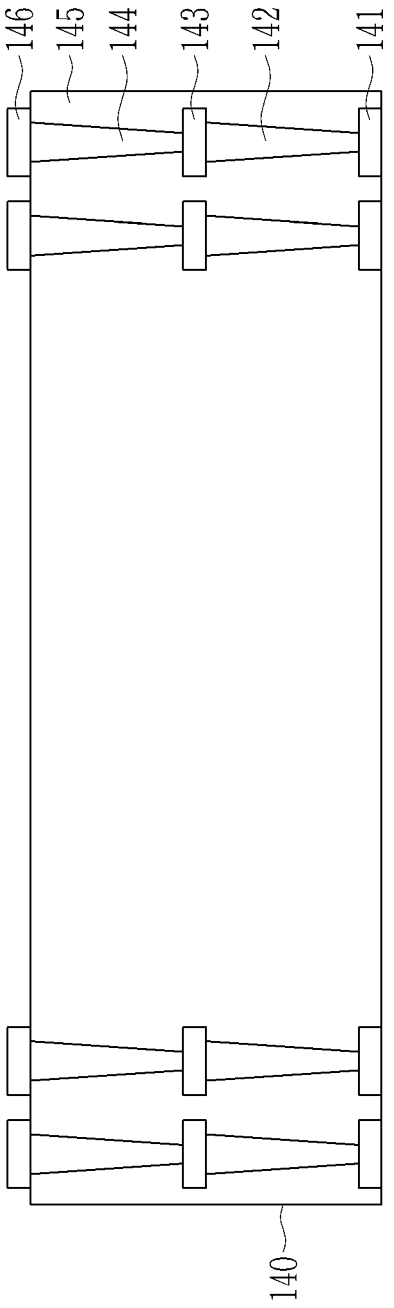
FIG. 5 is a cross-sectional view illustrating a step of providing an ETS as one step of the series of steps of a method for fabricating a semiconductor package.

FIG. 5 is a cross-sectional view illustrating a step of providing an ETS 140 as one step of the series of steps of a method for fabricating a semiconductor package.

Referring to FIG. 5, the ETS 140 may include an insulating layer 145, and a first wiring layer 141, first vias 142, a second wiring layer 143, and second vias 144 formed in the insulating layer 145, and a third wiring layer 146 disposed on the insulating layer 145.

The insulating layer 145 surrounds the first wiring layer 141 (e.g., side surfaces of the first wiring layer 141), the first vias 142, the second wiring layer 143, and the second vias 144 (e.g., side surfaces of the second vias 144). In an embodiment, the insulating layer 145 may include a thermosetting resin such as an epoxy resin, a thermoplastic resin such as polyimide, or a mixture of such a resin and an inorganic filler. In an embodiment, the insulating layer 145 may include resin impregnated with a core material, such as glass fiber, glass cloth, and glass fabric, together with an inorganic filler. In an embodiment, the insulating layer 145 may include prepreg, Ajinomoto build-up film (ABF), FR-4, and bismaleimide triazine (BT). In an embodiment, the insulating layer 145 may include photoimageable dielectric (PID) (a photosensitive dielectric).

The first wiring layer 141, the second wiring layer 143, and the third wiring layer 146 may include at least one of copper, aluminum, silver, tin, gold, nickel, lead, titanium, and alloys thereof. The first vias 142 and the second vias 144 electrically couple the first wiring layer 141, the second wiring layer 143, and the third wiring layer 146 formed in different layers. The first vias 142 and the second vias 144 may include at least one of copper, aluminum, silver, tin, gold, nickel, lead, titanium, and alloys thereof.

Figure 6:
FIG. 6 is a cross-sectional view illustrating a step of forming a cavity in the ETS as one step of the series of steps of the method for fabricating the semiconductor package.

FIG. 6 is a cross-sectional view illustrating a step of forming a cavity in the ETS 140 as one step of the series of steps of the method for fabricating the semiconductor package.

Referring to FIG. 6, a cavity is formed in the ETS 140. The cavity passes through the insulating layer 145. In an embodiment, the cavity may be formed by a laser or a mechanical drill. In another embodiment, the cavity may be formed by an etching process.

Figure 7:
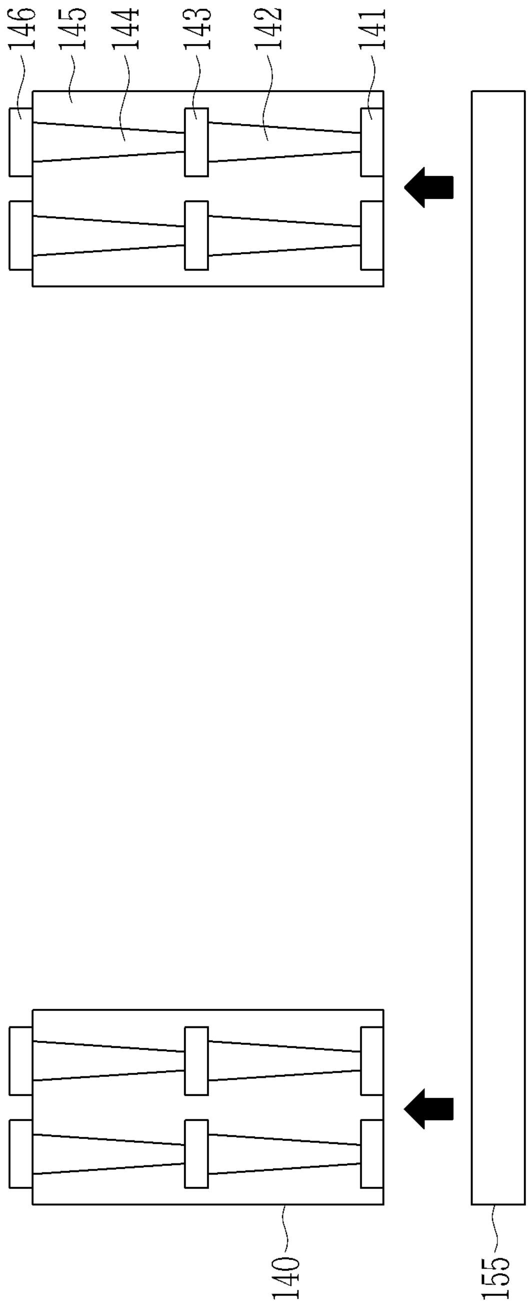
FIG. 7 is a cross-sectional view illustrating a step of attaching an adhesive film to the lower surface of the ETS having the cavity as one step of the series of steps of the method for fabricating the semiconductor package.

FIG. 7 is a cross-sectional view illustrating a step of attaching an adhesive film 155 to the lower surface of the ETS 140 having the cavity as one step of the series of steps of the method for fabricating the semiconductor package.

Referring to FIG. 7, the adhesive film 155 is attached to the lower surface of the ETS 140 having the cavity. In an embodiment, the adhesive film 155 may include polyimide (PI) film. In an embodiment, the adhesive film 155 may function as a support film for supporting the 3D IC structure 180.

Figure 8A:
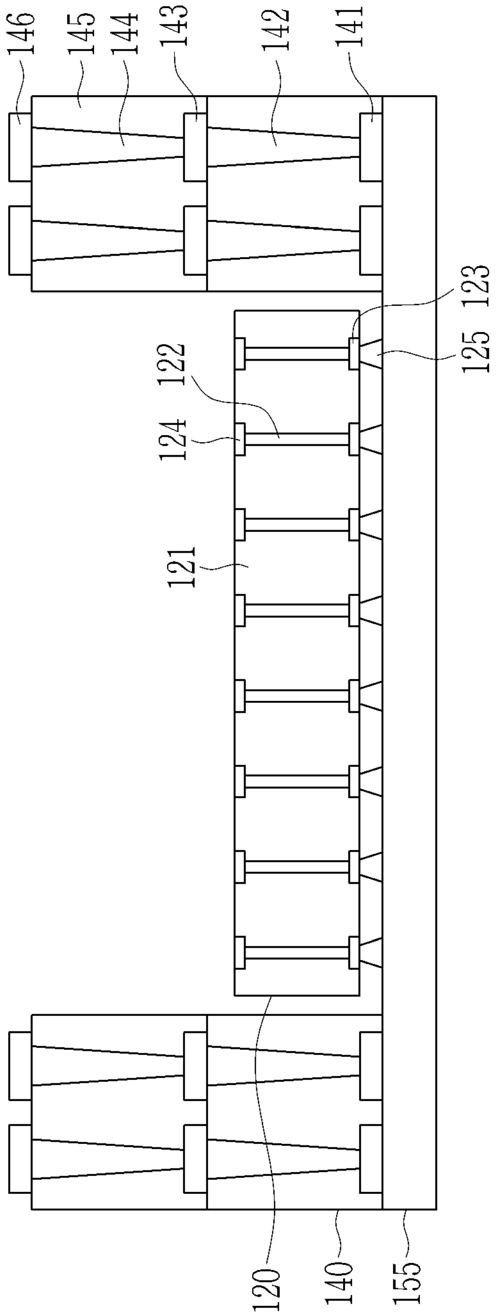
FIG. 8A is a cross-sectional view illustrating a step of bonding a second semiconductor chip die inside the cavity of the ETS as one step of the series of steps of the method for fabricating the semiconductor package.

FIG. 8A is a cross-sectional view illustrating a step of bonding the second semiconductor chip die 120 inside the cavity of the ETS 140 as one step of the series of steps of the method for fabricating the semiconductor package.

Referring to FIG. 8A, the second semiconductor chip die 120 is bonded to the adhesive film 155. Specifically, the lower surfaces of the connection terminals 125 of the second semiconductor chip die 120 are bonded to the adhesive film 155. Like this, a system-on-chip (SOC) is formed by stacking the 3D IC structure 180 in the process of fabricating the semiconductor package. Therefore, it is possible to reduce the manufacturing cost.

Since a system-on-chip (SOC) to be included in a package-on-package (POP) is fabricated in the process of fabricating the package-on-package (POP), a separate process for fabricating the system-on-chip (SOC) is unnecessary. Therefore, it is possible to reduce use of a molding material (e.g., EMC) which is typically used when a system-on-chip (SOC) is fabricated in a separate process.

Figure 8B:
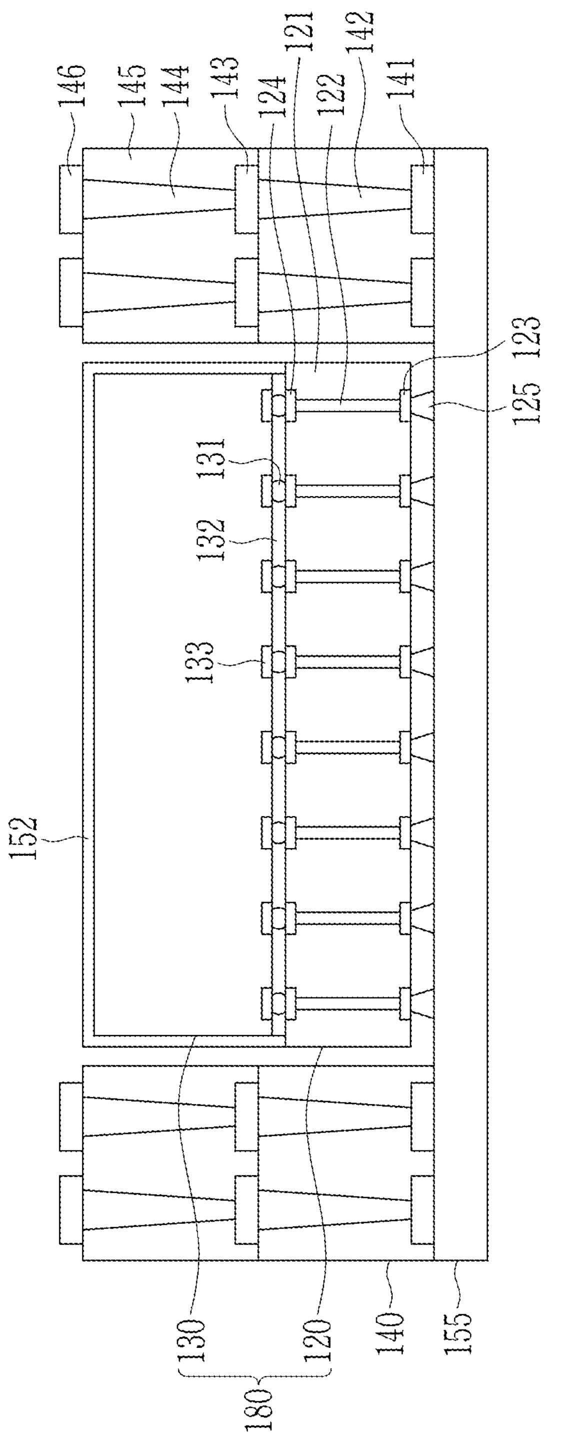
FIG. 8B is a cross-sectional view illustrating a step of bonding a 3D IC structure, manufactured in advance in a separate process, inside the cavity of the ETS, as one step of the series of steps of the method for fabricating the semiconductor package.

FIG. 8B is a cross-sectional view illustrating a step of bonding the 3D IC structure 180 manufactured in advance in a separate process, inside the cavity of the ETS 140, as one step of the series of steps of the method for fabricating the semiconductor package.

Referring to FIG. 8B, the 3D IC structure 180 manufactured in advance is bonded to the adhesive film 155. Unlike the embodiment of FIG. 8A, since the 3D IC structure 180 has been manufactured by performing a separate process, the 3D IC structure 180 includes a second molding material 152 encapsulating the first semiconductor chip die 130 on the second semiconductor chip die 120.

Figure 9A:
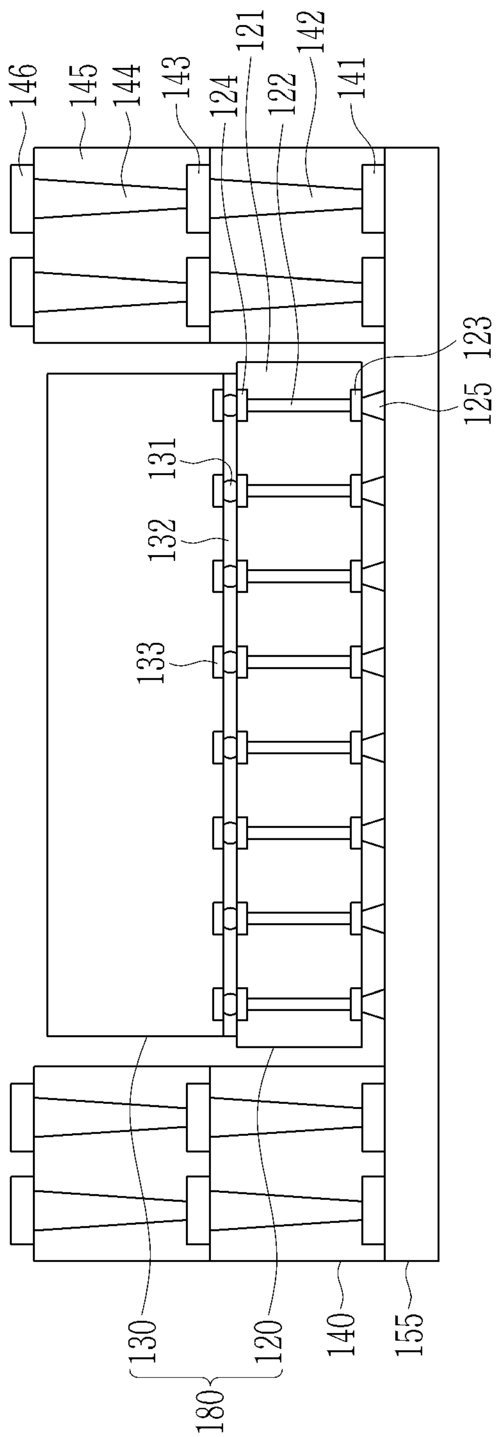
FIG. 9A is a cross-sectional view illustrating a step of bonding a first semiconductor chip die on the second semiconductor chip die using connection members, following the step of FIG. 8A, as one step of the series of steps of the method for fabricating the semiconductor package.

FIG. 9A is a cross-sectional view illustrating a step of bonding the first semiconductor chip die 130 to the upper surface of the second semiconductor chip die 120 using the connection members 131, following the step of FIG. 8A, as one step of the series of steps of the method for fabricating the semiconductor package.

Referring to FIG. 9A, the first semiconductor chip die 130 is bonded on the second semiconductor chip die 120. The bonding pads 133 of the first semiconductor chip die 130 and the bonding pads 124 of the second semiconductor chip die 120 can be bonded using the connection members 131. In an embodiment, the connection members 131 may include micro bumps.

Through this bonding step using the connection members 131, the first semiconductor chip die 130 is vertically stacked on the second semiconductor chip die 120, and in the process of forming a package-on-package (POP), a system-on-chip (SOC) including the first semiconductor chip die 130 and the second semiconductor chip die 120 is formed as the 3D IC structure 180.

Figure 9B:
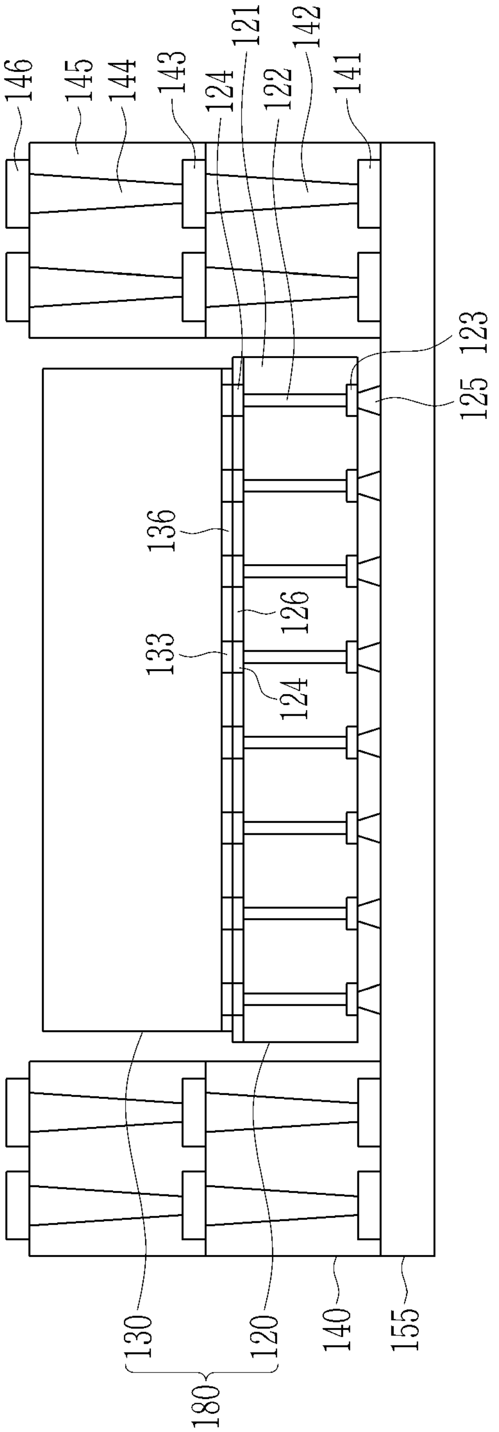
FIG. 9B is a cross-sectional view illustrating a step of bonding a first semiconductor chip die on the second semiconductor chip die using hybrid bonding, following the step of FIG. 8A, as one step of the series of steps of the method for fabricating the semiconductor package.

FIG. 9B is a cross-sectional view illustrating a step of bonding the first semiconductor chip die 130 on the second semiconductor chip die 120 using hybrid bonding, following the step of FIG. 8A, as one step of the series of steps of the method for fabricating the semiconductor package.

Referring to FIG. 9B, the second semiconductor chip die 120 is bonded on the first semiconductor chip die 130 by hybrid bonding. Hybrid bonding is bonding two devices by a method of fusing the same material of the two devices using the bonding property of the same material. Here, the hybrid bonding means performing two different types of bonding, for example, bonding two devices by a first type of metal-to-metal bonding and a second type of nonmetal-to-nonmetal bonding.

The bonding pads 133 of the first semiconductor chip die 130 and the bonding pads 124 of the second semiconductor chip die 120 may be directly bonded by metal-to-metal bonding of the hybrid bonding. By the metal-to-metal bonding of the hybrid bonding, metallic bonds are formed at the interfaces between the bonding pads 133 of the first semiconductor chip die 130 and the bonding pads 124 of the second semiconductor chip die 120. The bonding pads 133 of the first semiconductor chip die 130 and the bonding pads 124 of the second semiconductor chip die 120 may be formed of the same material such that after hybrid bonding, the interfaces between the bonding pads 133 of the first semiconductor chip die 130 and the bonding pads 124 of the second semiconductor chip die 120 disappear. Through the bonding pads 133 of the first semiconductor chip die 130 and the bonding pads 124 of the second semiconductor chip die 120, the first semiconductor chip die 130 and the second semiconductor chip die 120 can be electrically connected to each other.

The silicon insulating layer 136 of the first semiconductor chip die 130 may be directly bonded to the silicon insulating layer 126 of the second semiconductor chip die 120 by nonmetal-to-nonmetal bonding of the hybrid bonding. By the nonmetal-to-nonmetal bonding of the hybrid bonding, a covalent bond is formed at the interface between the silicon insulating layer 136 of the first semiconductor chip die 130 and the silicon insulating layer 126 of the second semiconductor chip die 120. The silicon insulating layer 136 of the first semiconductor chip die 130 and the silicon insulating layer 126 of the second semiconductor chip die 120 may be formed of the same material such that after hybrid bonding, the interface between the silicon insulating layer 136 of the first semiconductor chip die 130 and the silicon insulating layer 126 of the second semiconductor chip die 120 disappears.

Through this bonding step using hybrid bonding, the first semiconductor chip die 130 is vertically stacked on the second semiconductor chip die 120, and in the process of forming a package-on-package (POP), a system-on-chip (SOC) including the first semiconductor chip die 130 and the second semiconductor chip die 120 is formed as the 3D IC structure 180.

Figure 10:
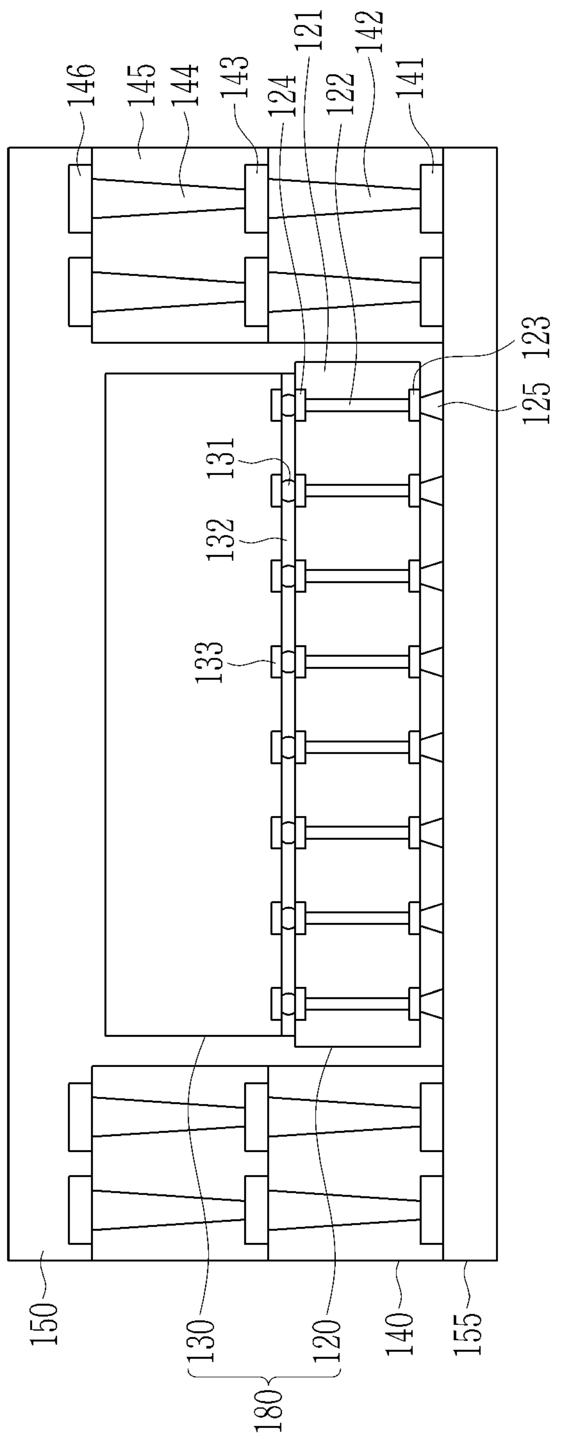
FIG. 10 is a cross-sectional view illustrating a step of encapsulating the 3D IC structure and the ETS with a molding material as one step of the series of steps of the method for fabricating the semiconductor package.

FIG. 10 is a cross-sectional view illustrating a step of encapsulating the 3D IC structure 180 and the ETS 140 with a molding material as one step of the series of steps of the method for fabricating the semiconductor package.

Referring to FIG. 10, the 3D IC structure 180 and the ETS 140 are encapsulated on the adhesive film 155 (later the front side redistribution layer 110) with the molding material 150. In some embodiments, the process of performing encapsulating with the molding material 150 may include a compression molding or transfer molding process. In an embodiment, the molding material 150 may be made of a thermosetting resin such as an epoxy resin. In another embodiment, the molding material 150 may be an epoxy molding compound (EMC).

Figure 11:
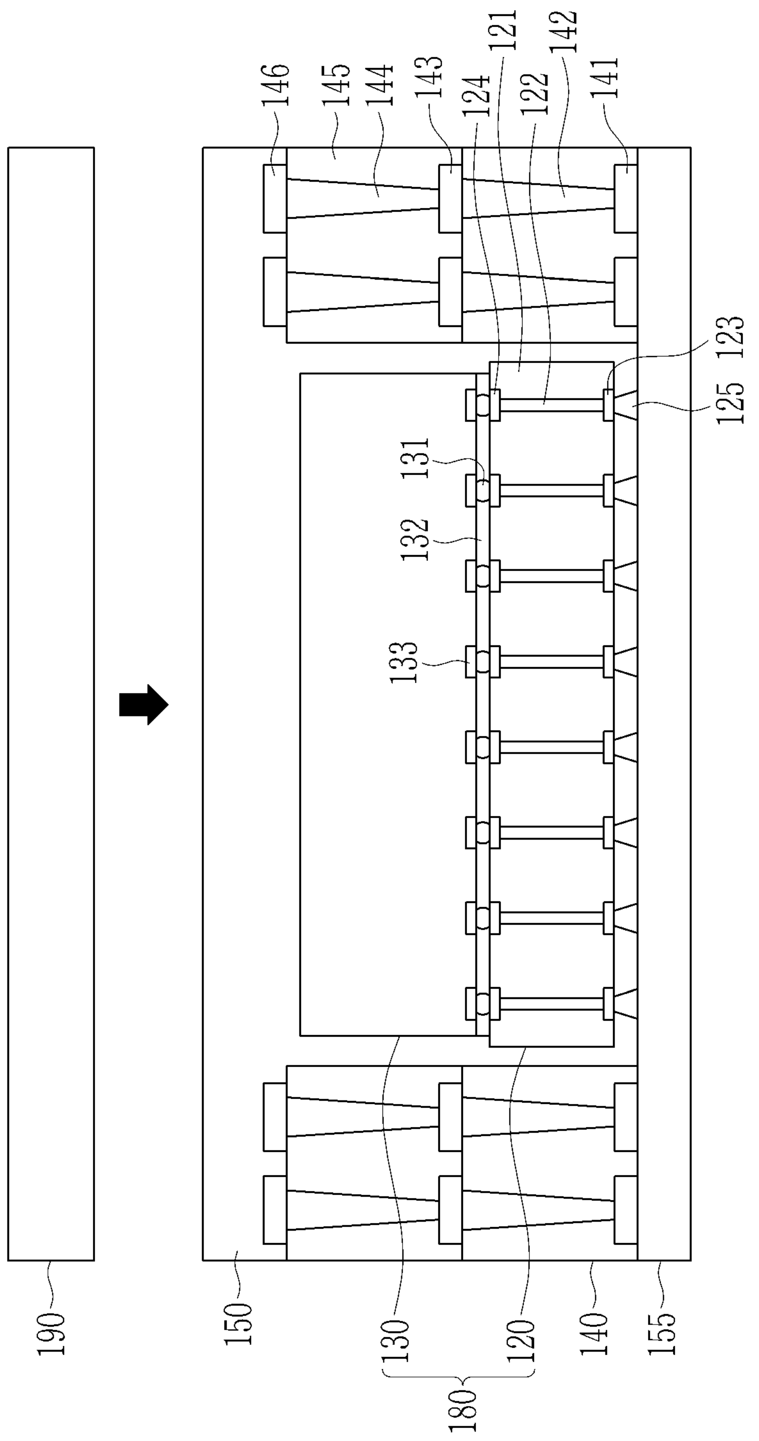
FIG. 11 is a cross-sectional view illustrating a step of bonding a first carrier on the molding material as one step of the series of steps of the method for fabricating the semiconductor package.

FIG. 11 is a cross-sectional view illustrating a step of bonding the first carrier 190 on the molding material 150 as one step of the series of steps of the method for fabricating the semiconductor package.

Referring to FIG. 11, the first carrier 190 is attached to the molding material 150. The first carrier 190 may include, for example, a silicon-based material such as glass or silicon oxide, an organic material, other materials such as aluminum oxide, an arbitrary combination thereof, or the like.

Figure 12:
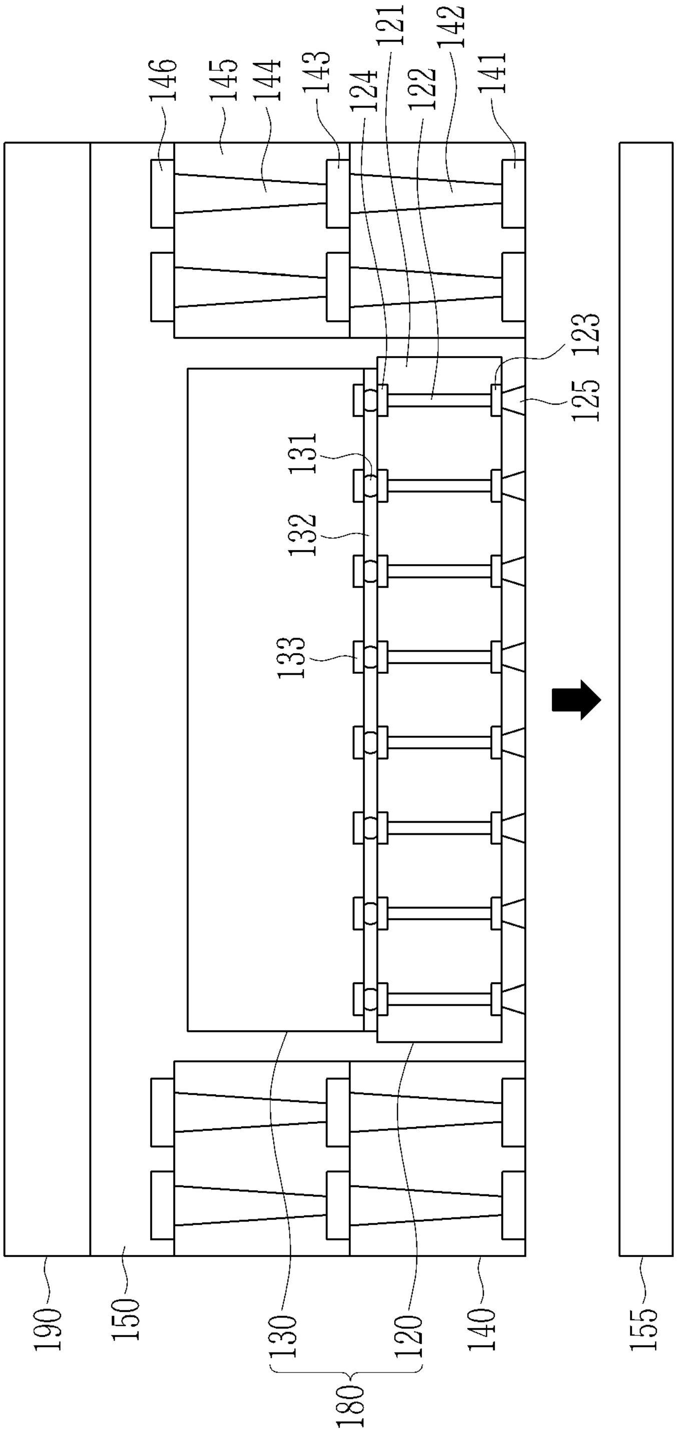
FIG. 12 is a cross-sectional view illustrating a step of debonding the adhesive film as one step of the series of steps of the method for fabricating the semiconductor package.

FIG. 12 is a cross-sectional view illustrating a step of debonding the adhesive film 155 as one step of the series of steps of the method for fabricating the semiconductor package.

Referring to FIG. 12, the adhesive film 155 is debonded from the lower surface of the ETS 140.

Figure 13:
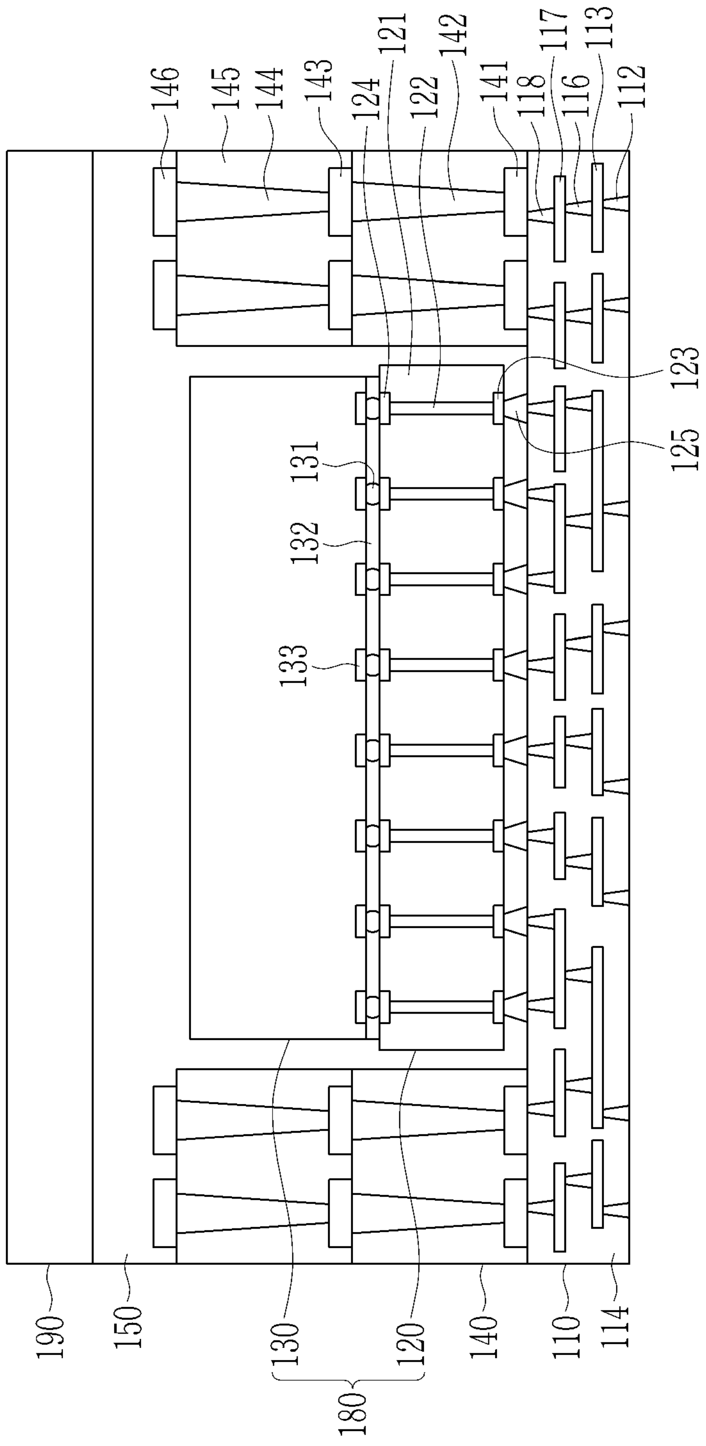
FIG. 13 is a cross-sectional view illustrating a step of forming a front side redistribution layer on the lower surface of the ETS and the lower surface of the 3D IC structure, as one step of the series of steps of the method for fabricating the semiconductor package.

FIG. 13 is a cross-sectional view illustrating a step of forming the front side redistribution layer 110 on the lower surface of the ETS 140 and the lower surface of the 3D IC structure 180 as one step of the series of steps of the method for fabricating the semiconductor package.

Referring to FIG. 13, the front side redistribution layer 110 is formed beneath the ETS 140 and beneath the lower surface of the 3D IC structure 180.

First, the dielectric layer 114 is formed on the lower surface of the ETS 140 and the lower surface of the 3D IC structure 180. In an embodiment, the dielectric layer 114 is formed of a polymer such as PBO or polyimide. In another embodiment, the dielectric layer 114 is formed of an inorganic dielectric material such as silicon nitride or silicon oxide. In an embodiment, the dielectric layer 114 may be formed by a CVD, ALD, or PECVD process.

After the dielectric layer 114 is formed, the third redistribution vias 118 are formed by selectively etching the dielectric layer 114 to form via holes and filling the via holes with a conductive material. The third redistribution vias 118 are bonded to the connection terminals 125 of the 3D IC structure 180 or the first wiring layer 141.

Subsequently, on the third redistribution vias 118 and the dielectric layer 114, a dielectric layer 114 is further deposited, and the second redistribution lines 117 are formed by selectively etching the additional deposited dielectric layer 114 to form openings and filling the openings with a conductive material.

Then, on the second redistribution lines 117 and the dielectric layer 114, a dielectric layer 114 is further deposited, and the second redistribution vias 116 are formed by selectively etching the additional deposited dielectric layer 114 to form via holes and filling the via holes with a conductive material.

Subsequently, on the second redistribution vias 116 and the dielectric layer 114, a dielectric layer 114 is further deposited, and the first redistribution lines 113 are formed by selectively etching the additional deposited dielectric layer 114 to form openings and filling the openings with a conductive material.

Next, on the first redistribution lines 113 and the dielectric layer 114, a dielectric layer 114 is further deposited, and the first redistribution vias 112 are formed by selectively etching the additional deposited dielectric layer 114 to form via holes and filling the via holes with a conductive material.

In an embodiment, the first redistribution vias 112, the first redistribution lines 113, the second redistribution vias 116, the second redistribution lines 117, and the third redistribution vias 118 may include at least one of copper, aluminum, tungsten, nickel, gold, tin, titanium, and alloys thereof. In an embodiment, the first redistribution vias 112, the first redistribution lines 113, the second redistribution vias 116, the second redistribution lines 117, and the third redistribution vias 118 may be formed by performing sputtering processes. In another embodiment, the first redistribution vias 112, the first redistribution lines 113, the second redistribution vias 116, the second redistribution lines 117, and the third redistribution vias 118 may be formed by forming a seed metal layer and performing an electroplating process.

Figure 14:
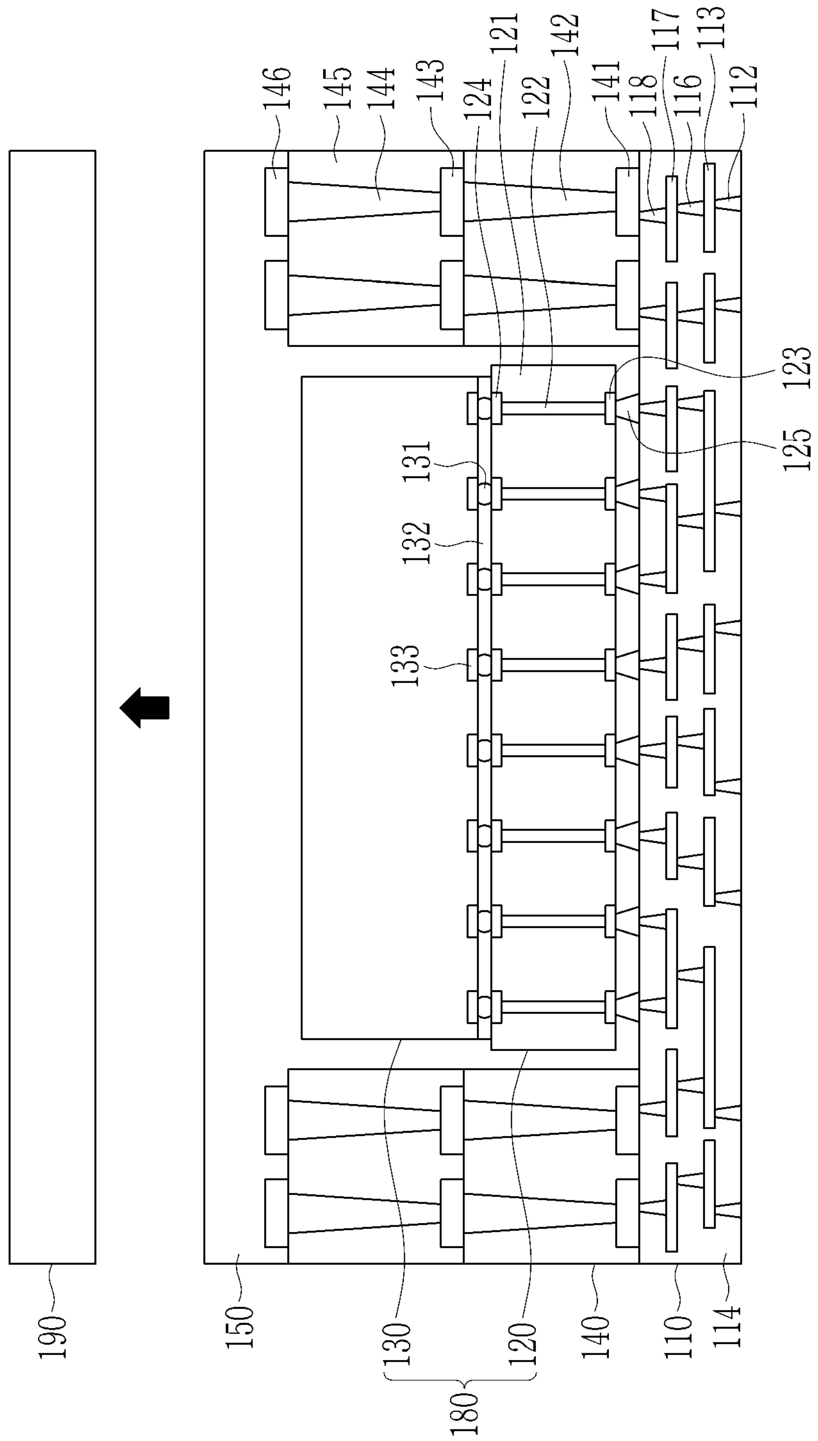
FIG. 14 is a cross-sectional view illustrating a step of debonding the first carrier from the molding material, as one step of the series of steps of the method for fabricating the semiconductor package.

FIG. 14 is a cross-sectional view illustrating a step of debonding the first carrier 190 from the molding material 150, as one step of the series of steps of the method for fabricating the semiconductor package.

Referring to FIG. 14, the first carrier 190 is debonded from the molding material 150.

Figure 15:
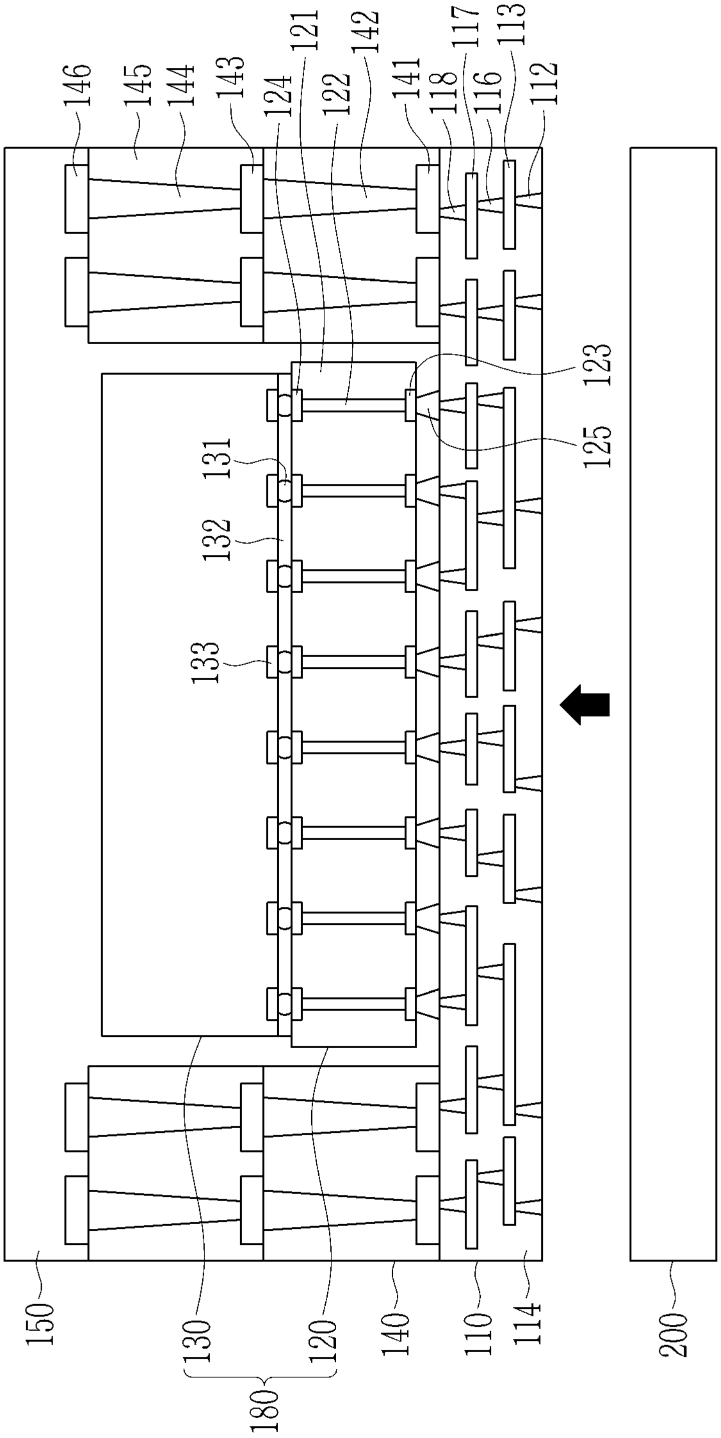
FIG. 15 is a cross-sectional view illustrating a step of bonding a second carrier to the lower surface of the front side redistribution layer, as one step of the series of steps of the method for fabricating the semiconductor package.

FIG. 15 is a cross-sectional view illustrating a step of bonding the second carrier 200 to the lower surface of the front side redistribution layer 110, as one step of the series of steps of the method for fabricating the semiconductor package.

Referring to FIG. 15, the second carrier 200 is attached to the lower surface of the front side redistribution layer 110. The second carrier 200 may include, for example, a silicon-based material such as glass or silicon oxide, an organic material, other materials such as aluminum oxide, an arbitrary combination thereof, or the like.

Figure 16:
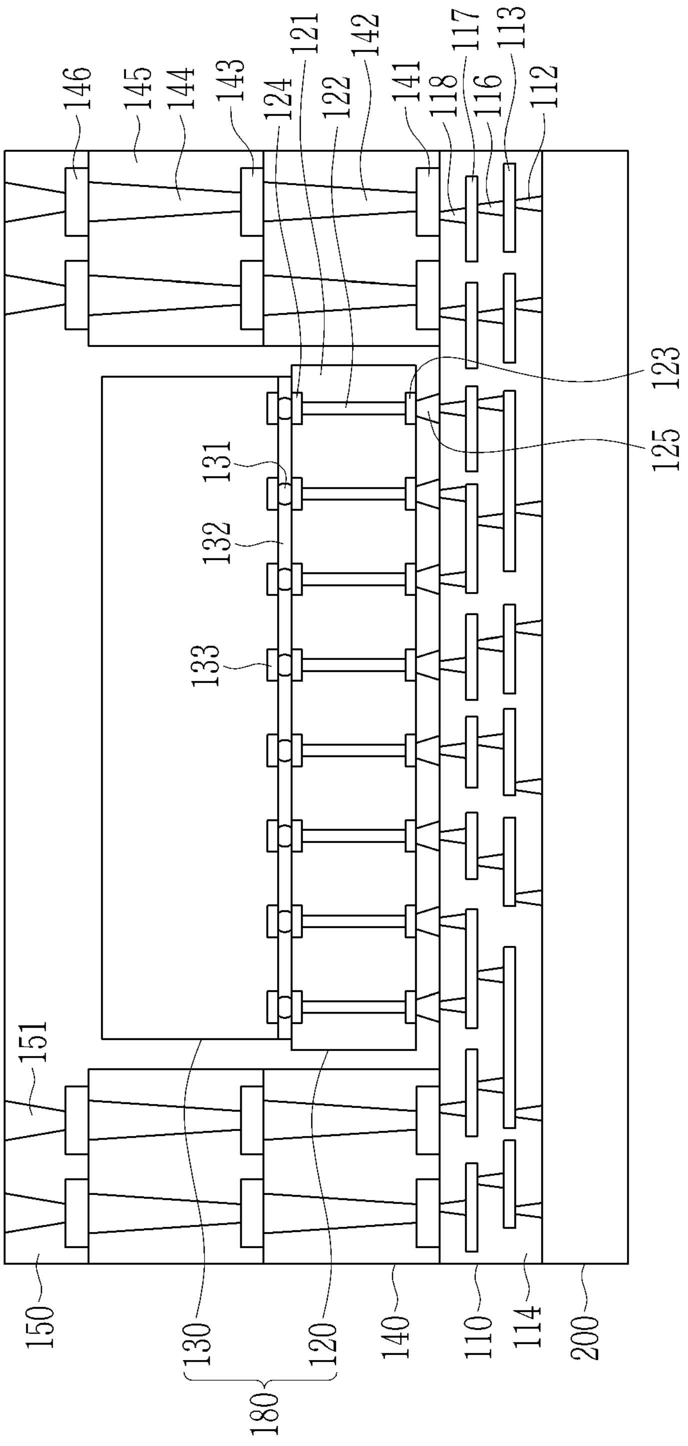
FIG. 16 is a cross-sectional view illustrating a step of forming a plurality of conductive fillers on the ETS, as one step of the series of steps of the method for fabricating the semiconductor package.

FIG. 16 is a cross-sectional view illustrating a step of forming the plurality of conductive fillers 151 on the ETS 140, as one step of the series of steps of the method for fabricating the semiconductor package.

Referring to FIG. 16, the conductive fillers 151 are formed on the ETS 140. First, via holes are formed in the molding material 150. In an embodiment, the via holes may be formed by a laser. Subsequently, the conductive fillers 151 are formed by filling the via holes with a metal material. In an embodiment, the conductive fillers 151 may be formed by performing a sputtering process. In another embodiment, the conductive fillers 151 may be formed by forming a metal seed layer and performing an electroplating process. In some embodiments, the conductive fillers 151 may be at least one of copper, nickel, gold, silver, aluminum, tungsten, titanium, tantalum, indium, molybdenum, manganese, cobalt, tin, magnesium, rhenium, beryllium, gallium, ruthenium, and alloys thereof.

FIG. 17 is a cross-sectional view illustrating a step of forming the back side redistribution layer 160 on the molding material 150, as one step of the series of steps of the method for fabricating the semiconductor package.

The dielectric layer 164 is formed on the molding material 150 having the conductive fillers 151. In an embodiment, the dielectric layer 164 is formed of a polymer such as PBO or polyimide. In another embodiment, the dielectric layer 164 is formed of an inorganic dielectric material such as silicon nitride or silicon oxide. In an embodiment, the dielectric layer 164 may be formed by a CVD, ALD, or PECVD process.

After the dielectric layer 164 is formed, the fourth redistribution vias 162 are formed by selectively etching the dielectric layer 164 to form via holes and filling the via holes with a conductive material. The fourth redistribution vias 162 are bonded to the conductive fillers 151.

Subsequently, on the fourth redistribution vias 162 and the dielectric layer 164, a dielectric layer 164 is further deposited, and the third redistribution lines 163 are formed by selectively etching the additional deposited dielectric layer 164 to form openings and filling the openings with a conductive material.

Then, on the third redistribution lines 163 and the dielectric layer 164, a dielectric layer 164 is further deposited, and the fifth redistribution vias 165 are formed by selectively etching the additional deposited dielectric layer 164 to form via holes and filling the via holes with a conductive material.

Subsequently, on the fifth redistribution vias 165 and the dielectric layer 164, a dielectric layer 164 is further deposited, and the fourth redistribution lines 166 are formed by selectively etching the additional deposited dielectric layer 164 to form openings and filling the openings with a conductive material.

Next, on the fourth redistribution lines 166 and the dielectric layer 164, a dielectric layer 164 is further deposited, and the sixth redistribution vias 167 are formed by selectively etching the additional deposited dielectric layer 164 to form via holes and filling the via holes with a conductive material.

Subsequently, on the sixth redistribution vias 167 and the dielectric layer 164, a dielectric layer 164 is further deposited, and the bonding pads 168 are formed by selectively etching the additional deposited dielectric layer 164 to form openings and filling the openings with a conductive material.

In some embodiments, the fourth redistribution vias 162, the third redistribution lines 163, the fifth redistribution vias 165, the fourth redistribution lines 166, the sixth redistribution vias 167, and the bonding pads 168 may include at least one of copper, aluminum, tungsten, nickel, gold, tin, titanium, and alloys thereof. In an embodiment, the fourth redistribution vias 162, the third redistribution lines 163, the fifth redistribution vias 165, the fourth redistribution lines 166, the sixth redistribution vias 167, and the bonding pads 168 may be formed by performing sputtering processes. In another embodiment, the fourth redistribution vias 162, the third redistribution lines 163, the fifth redistribution vias 165, the fourth redistribution lines 166, the sixth redistribution vias 167, and the bonding pads 168 may be formed by forming a seed metal layer and performing an electroplating process.

Figure 18:
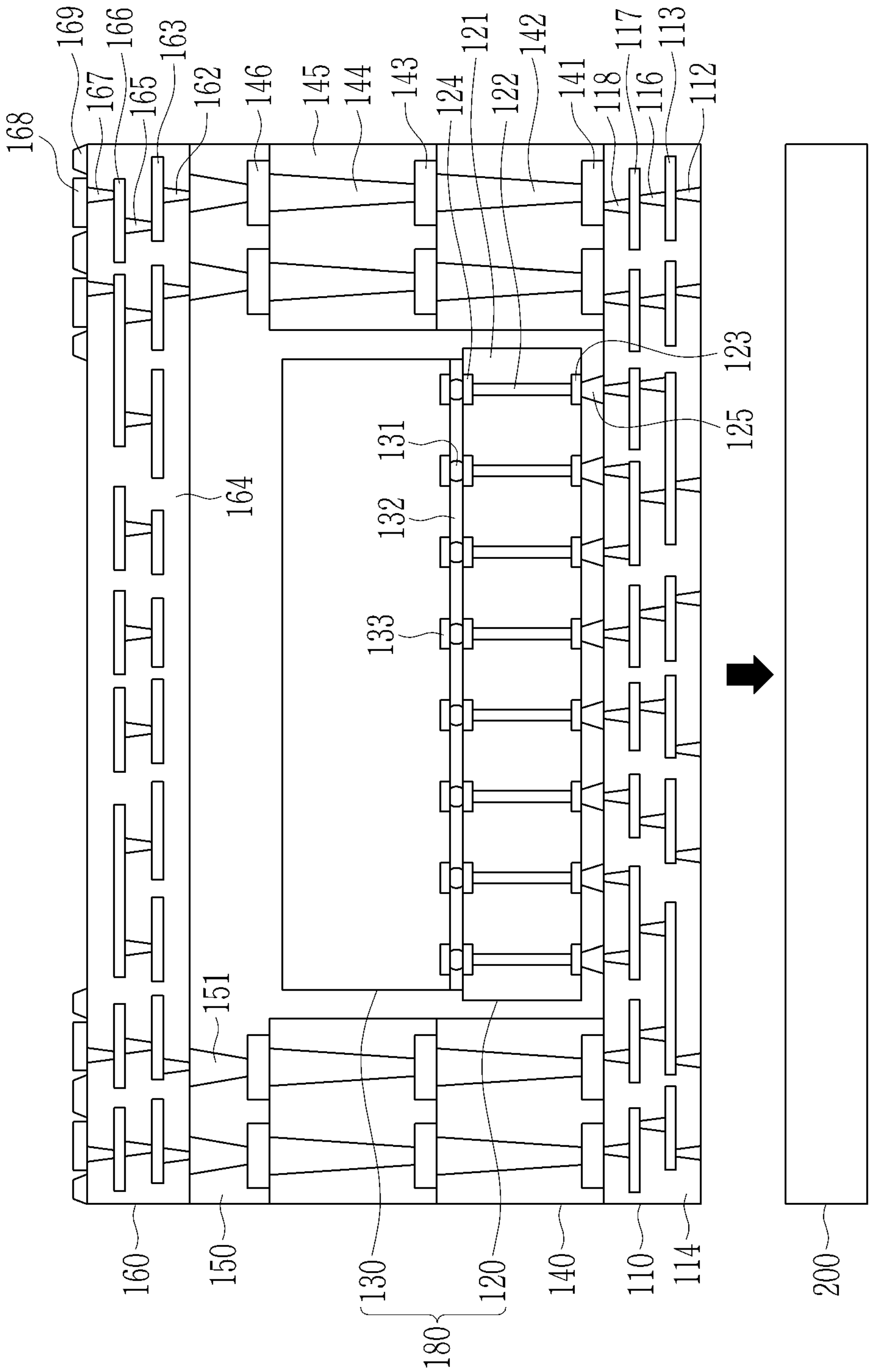
FIG. 18 is a cross-sectional view illustrating a step of debonding the second carrier from the lower surface of the front side redistribution layer, as one step of the series of steps of the method for fabricating the semiconductor package.

FIG. 18 is a cross-sectional view illustrating a step of debonding the second carrier 200 from the lower surface of the front side redistribution layer 110, as one step of the series of steps of the method for fabricating the semiconductor package.

Referring to FIG. 18, the second carrier 200 is debonded from the front side redistribution layer 110.

Figure 19:
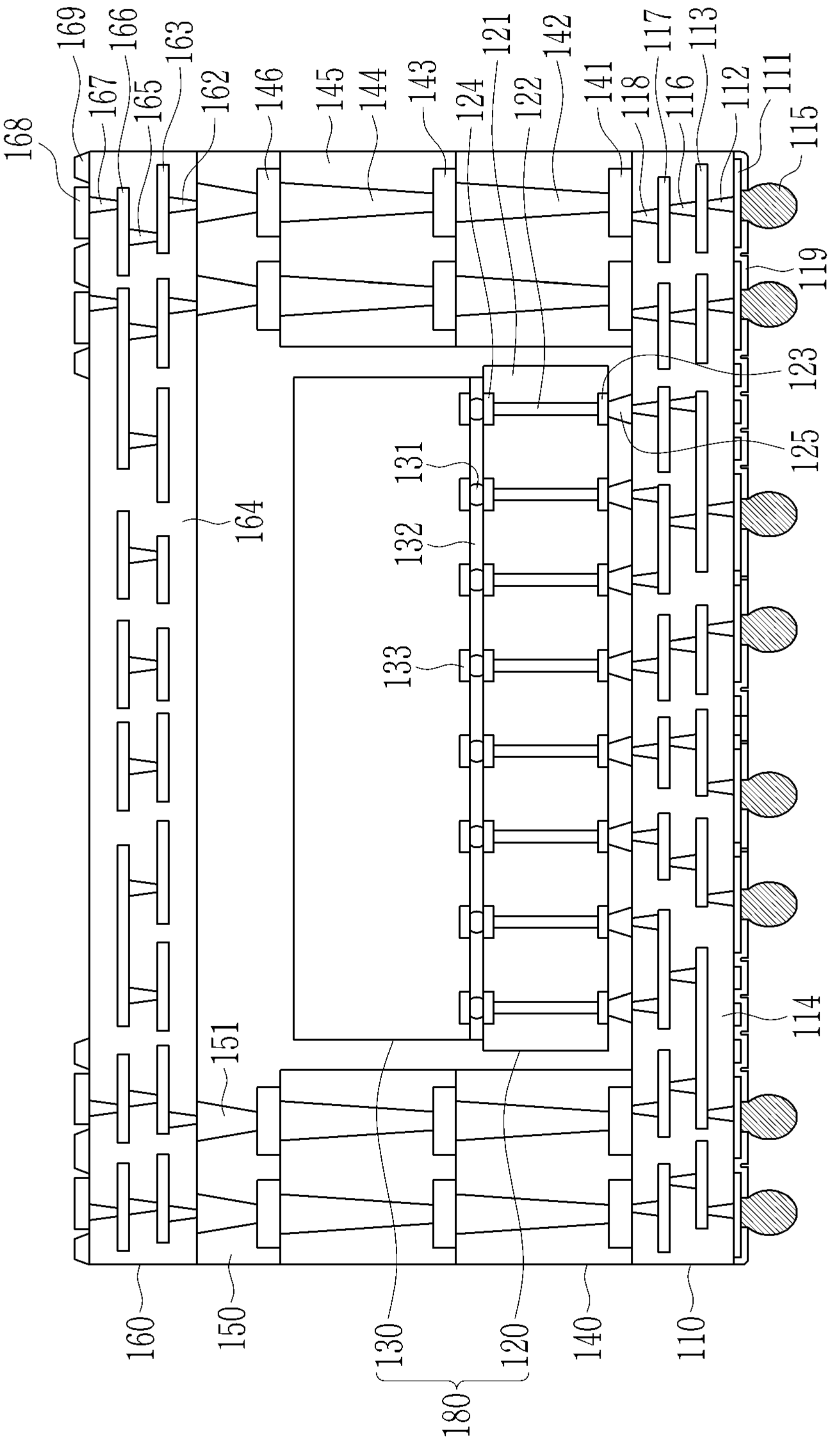
FIG. 19 is a cross-sectional view illustrating a step of forming external connection members on the lower surface of the front side redistribution layer, as one step of the series of steps of the method for fabricating the semiconductor package.

FIG. 19 is a cross-sectional view illustrating a step of forming the external connection members 115 on the lower surface of the front side redistribution layer 110, as one step of the series of steps of the method for fabricating the semiconductor package.

Referring to FIG. 19, the insulating layer 119 may be formed on the lower surface of the dielectric layer 114 of the front side redistribution layer 110, the bonding pads 111 may be formed on the first redistribution vias 112, and the external connection members 115 may be formed on the lower surfaces of the bonding pads 111. In an embodiment, the insulating layer 119 may be or include solder resist. The insulating layer 119 may have a plurality of openings for soldering of the external connection members 115 and the bonding pads 111. In an embodiment, the bonding pads 111 may include at least one of copper, nickel, zinc, gold, silver, platinum, palladium, chromium, titanium, and alloys thereof. In an embodiment, the external connection members 115 may include at least one of tin, silver, lead, nickel, copper, or alloys thereof.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A semiconductor package comprising:

a front side redistribution layer;

a three-dimensional integrated circuit (3D IC) structure on the front side redistribution layer, the 3D IC structure including a first semiconductor chip die and a second semiconductor chip die having through-silicon vias (TSVs), the first semiconductor chip die on the second semiconductor chip die and electrically coupled with the front side redistribution layer by the TSVs;

a printed circuit board on the front side redistribution layer and surrounding the 3D IC structure;

a molding material on the front side redistribution layer and at least partially encapsulating the 3D IC structure and the printed circuit board; and a back side redistribution layer on the molding material, wherein the printed circuit board comprises a printed circuit board insulating layer, and at least a portion of the molding material is between the printed circuit board insulating layer and the 3D IC structure.

2. The semiconductor package of claim 1, further comprising:

connection members between the first semiconductor chip die and the second semiconductor chip die, wherein the connection members include micro bumps.

3. The semiconductor package of claim 1, wherein:

the first semiconductor chip die includes a plurality of first bonding pads and a first insulating layer, and the second semiconductor chip die includes a plurality of second bonding pads and a second insulating layer.

4. The semiconductor package of claim 3, wherein the plurality of first bonding pads are directly bonded to the plurality of second bonding pads.

5. The semiconductor package of claim 3, wherein the plurality of first bonding pads and the plurality of second bonding pads include copper (Cu).

6. The semiconductor package of claim 3, wherein the first insulating layer is directly bonded to the second insulating layer.

7. The semiconductor package of claim 3, wherein the first insulating layer and the second insulating layer include silicon oxide.

8. The semiconductor package of claim 1, wherein:

the second semiconductor chip die includes a plurality of connection terminals, the front side redistribution layer includes a plurality of redistribution vias at an uppermost level thereof, and the plurality of redistribution vias are directly bonded to the plurality of connection terminals.

9. The semiconductor package of claim 1, wherein the molding material includes an epoxy molding compound (EMC).

10. The semiconductor package of claim 1, wherein the printed circuit board includes an embedded trace substrate (ETS).

11. The semiconductor package of claim 1, wherein the 3D IC structure includes a system-on-chip (SOC).

12. A semiconductor package comprising:

a front side redistribution layer including a plurality of first redistribution vias;

a three-dimensional integrated circuit (3D IC) structure on the front side redistribution layer, the 3D IC structure including a first semiconductor chip die and a second semiconductor chip die having through-silicon vias (TSVs), the first semiconductor chip die on the second semiconductor chip die and electrically coupled with the front side redistribution layer by the TSVs;

a printed circuit board on the front side redistribution layer and surrounding the 3D IC structure;

a plurality of conductive fillers on the printed circuit board;

a molding material on the front side redistribution layer and at least partially encapsulating the 3D IC structure, the printed circuit board, and the plurality of conductive fillers;

a back side redistribution layer on the molding material and including a plurality of second redistribution vias; and a third semiconductor chip die on the back side redistribution layer, wherein the printed circuit board comprises a printed circuit board insulating layer, and at least a portion of the molding material is between the printed circuit board insulating layer and the 3D IC structure.

13. The semiconductor package of claim 12, wherein:

a width of an uppermost part of each first redistribution via of the plurality of first redistribution vias is smaller than a width of a lowermost part of each first redistribution via of the plurality of first redistribution vias, and a width of an uppermost part of each second redistribution via of the plurality of second redistribution vias is larger than a width of a lowermost part of each second redistribution via of the plurality of second redistribution vias.

* * * * *